US012356814B2

(12) United States Patent
Shi et al.

(10) Patent No.: US 12,356,814 B2
(45) Date of Patent: Jul. 8, 2025

(54) DISPLAY PANEL, DISPLAY DEVICE

(71) Applicants: Chengdu BOE Optoelectronics Technology Co., Ltd., Sichuan (CN); BOE Technology Group Co., Ltd., Beijing (CN)

(72) Inventors: Kunyan Shi, Beijing (CN); Hailong Yan, Beijing (CN); Dongjie Wu, Beijing (CN); Wenbo Hu, Beijing (CN); Xinyu Wei, Beijing (CN); Kai Zhang, Beijing (CN); Peng Xu, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/914,746

(22) PCT Filed: Sep. 23, 2021

(86) PCT No.: PCT/CN2021/120004
§ 371 (c)(1),
(2) Date: Sep. 26, 2022

(87) PCT Pub. No.: WO2023/044682
PCT Pub. Date: Mar. 30, 2023

(65) Prior Publication Data
US 2024/0397761 A1    Nov. 28, 2024

(51) Int. Cl.
*H10K 59/131*    (2023.01)
*G09G 3/3225*    (2016.01)
*H10K 59/121*    (2023.01)

(52) U.S. Cl.
CPC ......... *H10K 59/131* (2023.02); *G09G 3/3225* (2013.01); *H10K 59/1213* (2023.02);
(Continued)

(58) Field of Classification Search
CPC ............ H10K 59/131; H10K 59/1213; G09G 3/3225; G09G 2300/0426;
(Continued)

(56) References Cited

U.S. PATENT DOCUMENTS 10,431,153 B2    10/2019    Gao et al.
2018/0130410 A1    5/2018    Gao et al.
(Continued)

FOREIGN PATENT DOCUMENTS

CN    107274830 A    10/2017
CN    107610651 A    1/2018
(Continued)

OTHER PUBLICATIONS

Written Opinion of the International Searching Authority issued in Application No. PCT/CN2021/120004, dated May 27, 2022,(4p).

*Primary Examiner* — Abhishek Sarma
(74) *Attorney, Agent, or Firm* — Arch & Lake LLP

(57) ABSTRACT

The display panel includes a pixel driving circuit. The pixel driving circuit includes a driving transistor and an eighth transistor. A first terminal of the eighth transistor is connected to a first terminal of the driving transistor, and a second terminal of the eighth transistor is connected to a third initial signal line. The display panel further includes: a base substrate, a first active layer, a first conductive layer, and the third initial signal line. The first active layer is located on a side of the base substrate. The first active layer includes an eighth active portion, a second active portion, a ninth active portion, a tenth active portions, and an eleventh active portion. The eighth active portion is connected between the ninth active portion and the tenth active portion. The eleventh active portion is connected to a side of the second active portion.

20 Claims, 28 Drawing Sheets

(52) U.S. Cl.
CPC ............. *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0257* (2013.01)

(58) Field of Classification Search
CPC ... G09G 2300/0819; G09G 2300/0842; G09G 2300/0861; G09G 2310/08; G09G 2320/0257; H10D 86/441; H10D 86/60; H10D 30/6757
See application file for complete search history.

(56) References Cited

U.S. PATENT DOCUMENTS

| | | | |
|---|---|---|---|
| 2022/0044636 A1 | 2/2022 | Mou et al. | |
| 2024/0257734 A1* | 8/2024 | Zhang | ............... H10K 59/1213 |

FOREIGN PATENT DOCUMENTS

| | | |
|---|---|---|
| CN | 108596083 A | 9/2018 |
| CN | 108628049 A | 10/2018 |
| CN | 109599064 A | 4/2019 |
| CN | 110189706 A | 8/2019 |
| CN | 107610651 B | 11/2019 |
| CN | 113224123 A | 8/2021 |
| CN | 113327947 A | 8/2021 |
| CN | 114514573 A | 5/2022 |

\* cited by examiner

DISPLAY PANEL, DISPLAY DEVICE

CROSS-REFERENCE TO RELATED APPLICATION

The present application is a 35 U.S.C. 371 national phase application of PCT International Application No. PCT/CN2021/120004, filed on Sep. 23, 2021, the entire disclosure of which is incorporated herein by reference for all purposes.

TECHNICAL FIELD

The present disclosure relates to the field of display technology, and in particular, to a display panel and a display device.

BACKGROUND

In the related art, a parasitic capacitance exists between the gate and the source of the driving transistor in the pixel driving circuit. During the reset phase of the pixel driving circuit, the gate voltage of the driving transistor is initialized to be the initial voltage. Under the coupling effect of the above-mentioned parasitic capacitance, the source voltage of the driving transistor also changes accordingly. In the reset stage, when different gray scales are reset, the gate voltage of the driving transistor changes in different amounts, and thus the change amount in the source voltage of the driving transistor is also different. This in turn causes the source voltage of the driving transistor to be different after the reset stage is completed, and the gate-to-source voltage difference (Vgs) is also different. At the same time, since Vgs of the driving transistor will affect its threshold voltage, the display panel will have a residual image.

It should be noted that the information disclosed in the above Background section is only for enhancement of understanding of the background of the present disclosure, and therefore may contain information that does not constitute the prior art that is already known to a person of ordinary skill in the art.

SUMMARY

According to an aspect of the present disclosure, there is provided a display panel. The display panel includes a pixel driving circuit. The pixel driving circuit includes a driving transistor and an eighth transistor. The first terminal of the eighth transistor is connected to the first terminal of the driving transistor, and the second terminal of the eighth transistor is connected to the third initial signal line. The display panel further includes: a base substrate, a first active layer, a first conductive layer, and the third initial signal line. The first active layer is located on a side of the base substrate. The first active layer includes an eighth active portion, a second active portion, a ninth active portion, a tenth active portion, and an eleventh active portion. The eighth active portion is connected between the ninth active portion and the tenth active portion. The eleventh active portion is connected to a side of the second active portion. The eighth active portion is used to form the channel region of the eighth transistor. The second active portion is used to form the channel region of the driving transistor. The ninth active portion is electrically connected to the the eleventh active portion. The first conductive layer is located on a side of the first active layer away from the base substrate. The first conductive layer includes a first reset signal line and a first conductive portion. The orthographic projection on the base substrate of the first reset signal line extends along a first direction, and covers the orthographic projection on the base substrate of the eighth active portion. A partial structure of the first reset signal line is used to form the gate of the eighth transistor. The orthographic projection on the base substrate of the first conductive portion covers the orthographic projection on the base substrate of the second active portion. The first conductive portion is used to form the gate of the driving transistor. The third initial signal line is electrically connected to the tenth active portion.

In an exemplary embodiment of the present disclosure, the display panel further includes a third conductive layer. The third conductive layer is located on a side of the first conductive portion away from the base substrate. The third conductive layer includes the third initial signal line.

In an exemplary embodiment of the present disclosure, the orthographic projection on the base substrate of the third initial signal line at least partially overlaps with the orthographic projection on the base substrate of the first reset signal line.

In an exemplary embodiment of the present disclosure, the display panel further includes a fourth conductive layer. The fourth conductive layer is located on a side of the third conductive layer away from the base substrate. The fourth conductive layer includes a first bridge part. The first bridge part is connected to the third initial signal line and the tenth active portion respectively through via holes.

In an exemplary embodiment of the present disclosure, the pixel driving circuit further includes a fifth transistor. The first terminal of the fifth transistor is connected to a power supply line, and a second terminal of the fifth transistor is connected to a first terminal of the driving transistor. The first active layer further includes a fifth active portion. The fifth active portion is used to form the channel region of the fifth transistor. The fifth active portion is connected to a side of the eleventh active portion far away from the second active portion. The first conductive layer further includes an enable signal line. The orthographic projection on the base substrate of the enable signal line extends along the first direction, covers the orthographic projection on the base substrate of the fifth active portion, and is located between the orthographic projection on the base substrate of the eleventh active portion and the orthographic projection on the base substrate of the ninth active portion. A partial structure of the enable signal line is used to form the gate of the fifth transistor. The display panel further includes a fourth conductive layer. The fourth conductive layer is located on a side of the first conductive layer away from the base substrate. The fourth conductive layer includes a second bridge part. The second bridge part is connected to the ninth active portion and the eleventh active portion respectively through via holes.

In an exemplary embodiment of the present disclosure, the orthographic projection on the base substrate of the ninth active portion is located between the orthographic projection on the base substrate of the first reset signal line and the orthographic projection on the base substrate of the enable signal line.

In an exemplary embodiment of the present disclosure, the pixel driving circuit further includes a sixth transistor and a seventh transistor. The first terminal of the sixth transistor is connected to the second terminal of the driving transistor, and the gate of the sixth transistor is connected to the enable signal line. The first terminal of the seventh transistor is connected to the second initial signal line, the second terminal of the seventh transistor is connected to the second terminal of the sixth transistor, and the gate of the seventh transistor is connected to the first reset signal line. The first active layer further includes: a sixth active portion, a seventh active portion, and a twelfth active portion. The sixth active portion is connected to a side of the second active portion away from the eleventh active portion, and is used to form the channel region of the sixth transistor. The seventh active portion is connected to a side of the sixth active portion away from the second active portion, and used to form the channel region of the seventh transistor. The twelfth active portion is connected to a side of the seventh active portion away from the sixth active portion. The first conductive layer further includes an enable signal line. The orthographic projection on the base substrate of the enable signal line extends along the first direction, and covers the orthographic projection on the base substrate of the sixth active portion. A partial structure of the enable signal line is used to form the gate of the sixth transistor. The orthographic projection on the base substrate of the first reset signal line covers the orthographic projection on the base substrate of the seventh active portion. A partial structure of the first reset signal line is used to form the gate of the seventh transistor. The display panel further includes a fourth conductive layer. The fourth conductive layer is located on a side of the first conductive layer away from the base substrate. The fourth conductive layer includes the second initial signal line. The second initial signal line is connected to the twelfth active portion through a via hole.

In an exemplary embodiment of the present disclosure, the pixel driving circuit further includes a third transistor and a fourth transistor. The first terminal of the third transistor is connected to the gate of the driving transistor, the second terminal of the third transistor is connected to the second terminal of the driving transistor, and the gate of the third transistor is connected to the second gate line. The first terminal of the fourth transistor is connected to the first initial signal line, the second terminal of the fourth transistor is connected to the gate of the driving transistor, and the gate of the fourth transistor is connected to the second reset signal line. The display panel further includes a second active layer and a third conductive layer. The second active layer is located on a side of the first conductive layer away from the base substrate. The second active layer includes a third active portion and a fourth active portion. The third active portion is used to form the channel region of the third transistor. The fourth active portion is used to form the channel region of the fourth transistor. The third conductive layer is located on a side of the second active layer away from the base substrate. The third conductive layer includes the second gate line and the second reset signal line. The orthographic projection on the base substrate of the second gate line extends along the first direction, and covers the orthographic projection on the base substrate of the third active portion. A partial structure of the second gate line is used to form the top gate of the third transistor. The orthographic projection on the base substrate of the second reset signal line extends along the first direction, and covers the orthographic projection on the base substrate of the fourth active portion. A partial structure of the second reset signal line is used to form the top gate of the fourth transistor.

In an exemplary embodiment of the present disclosure, the display panel further includes: a second conductive layer, located between the first conductive layer and the second active layer. The second conductive layer includes: a third gate line and a third reset signal line. The orthographic projection of the third gate line on the base substrate extends along the first direction, and covers the orthographic projection of the third active portion on the base substrate. A partial structure of the third gate line is used to form the bottom gate of the third transistor. The orthographic projection of the third reset signal line on the base substrate extends along the first direction, and covers the orthographic projection on the base substrate of the fourth active portion. A partial structure of the third reset signal line is used to form the bottom gate of the fourth transistor.

In an exemplary embodiment of the present disclosure, the orthographic projection on the base substrate of the second gate line is located at a side of the orthographic projection on the base substrate of the first conductive portion away from the orthographic projection on the base substrate of the first reset signal line. The orthographic projection of the second reset signal line on the base substrate is located at a side of the orthographic projection of the second gate line on the base substrate away from the orthographic projection of the base substrate of the first conductive portion.

In an exemplary embodiment of the present disclosure, the pixel driving circuit further includes a sixth transistor and a seventh transistor. The first terminal of the sixth transistor is connected to the second terminal of the driving transistor. The first terminal of the seventh transistor is connected to the second initial signal line, and the second terminal of the seventh transistor is connected to the second terminal of the sixth transistor. The display panel further includes a fourth conductive layer. The fourth conductive layer is located on a side of the third conductive layer away from the base substrate. The fourth conductive layer includes the second initial signal line. The first conductive layer further includes the first initial signal line. The orthographic projection of the first initial signal line on the base substrate extends along the first direction, and is located at a side of the orthographic projection on the base substrate of the second reset signal line away from the orthographic projection on the base substrate of the second gate line. The display panel includes a plurality of pixel driving circuits arranged in the second direction and the first direction. The first direction is the row direction, and the second direction is the column direction. The orthographic projection on the base substrate of the first initial signal line in the pixel driving circuit of a row at least partially overlaps with the orthographic projection on the base substrate of the second initial signal line in the pixel driving circuit of the previous row.

In an exemplary embodiment of the present disclosure, the pixel driving circuit further includes a first transistor. The first terminal of the first transistor is connected to the data line, the second terminal of the first transistor is connected to the first terminal of the driving transistor, and the gate of the first transistor is connected to the first gate line. The first active layer further includes a first active portion. The first active portion is used to form a channel region of the first transistor. The first conductive layer further includes the first gate line. The orthographic projection of the first gate line on the base substrate extends along the first direction, and covers the orthographic projection of the first active portion on the base substrate. A partial structure of the first gate line is used to form the gate of the first transistor. The orthographic projection of the first gate line on the base substrate is located between the orthographic projection on the substrate of the second gate line and the orthographic projection of the second reset signal line on the base substrate. The display panel further includes: a fourth conductive layer and a fifth conductive layer. The fifth conductive layer is located on a side of the fourth conductive layer away from the base substrate. The fifth conductive layer includes the data line. The orthographic projection of the data line on the base substrate extends along the second direction. The second direction intersects the first direction.

In an exemplary embodiment of the present disclosure, the display panel includes a plurality of pixel driving circuits. The plurality of the pixel driving circuits includes a first pixel driving circuit and a second pixel driving circuit that are adjacently arranged in the first direction. The first pixel driving circuit and the second pixel driving circuit are at least partially mirror-symmetrical with each other.

In an exemplary embodiment of the present disclosure, the display panel further includes a fourth conductive layer. The fourth conductive layer is located on a side of the first conductive layer away from the base substrate. The fourth conductive layer includes a first bridge part. The first bridge part is connected to the third initial signal line and the tenth active portion through via holes respectively. The first active layer further includes a thirteenth active portion. The thirteenth active portion is connected between the tenth active portion in the first pixel driving circuit and the tenth active portion in the second pixel driving circuit. The first bridge part in the first pixel driving circuit is reused as the first bridge part in the second pixel driving circuit.

In an exemplary embodiment of the present disclosure, the eighth transistor in the first pixel driving circuit is reused as the eighth transistor in the second pixel driving circuit.

In an exemplary embodiment of the present disclosure, the fourth conductive layer further includes a second bridge part. The second bridge part is connected to the ninth active portion and the eleventh active portion through via holes, respectively. The eighth active portion in the first pixel driving circuit is reused as the eighth active portion in the second pixel driving circuit. The ninth active portion in the first pixel driving circuit is reused as the ninth active portion in the second pixel driving circuit. The tenth active portion in the first pixel driving circuit is reused as the tenth active portion in the second pixel driving circuit. The display panel further includes a ninth bridge part. The second bridge part in the first pixel driving circuit is further connected to the ninth bridge part through a via hole. The second bridge part in the second pixel driving circuit is connected to the ninth bridge part through a via hole, for connecting with the ninth active portion in the first pixel driving circuit.

In an exemplary embodiment of the present disclosure, the display panel further includes a second conductive layer. The second conductive layer is located on a side of the first conductive layer away from the base substrate. The second conductive layer includes the ninth bridge part.

In an exemplary embodiment of the present disclosure, the pixel driving circuit further includes a capacitor and a fifth transistor. The first terminal of the fifth transistor is connected to a power supply line, and the second terminal of the fifth transistor is connected to the first terminal of the driving transistor. The first electrode of the capacitor is connected to the gate of the driving transistor, and the second electrode of the capacitor is connected to the power supply line. The first active layer further includes: a fifth active portion and a fourteenth active portion. The fifth active portion is connected to a side of the eleventh active portion away from the second active portion, for forming the channel region of the fifth transistor. The fourteenth active portion is connected between the fifth active portion in the first pixel driving circuit and the fifth active portion in the second pixel driving circuit. The display panel further includes: a second conductive layer, a fourth conductive layer, and a fifth conductive layer. The second conductive layer is located on a side of the first conductive layer away from the base substrate. The second conductive layer includes: a second conductive portion and a first connection part. The orthographic projection on the base substrate of the second conductive portion at least partially overlaps with the orthographic projection of the first conductive portion on the base substrate. The first conductive portion is also used to form the first electrode of the capacitor, and the first conductive portion is used to form the second electrode of the capacitor. The the first connection part is connected between the second conductive portion in the first pixel driving circuit and the second conductive portion in the second pixel driving circuit. The fourth conductive layer is located on a side of the second conductive layer away from the base substrate. The fourth conductive layer includes a third bridge part. The third bridge part is respectively connected to the fourteenth active portion and the first connection part through via holes. The fifth conductive layer is located on a side of the fourth conductive layer away from the base substrate. The fifth conductive layer includes the power supply line. The orthographic projection of the power supply line on the base substrate extends along the second direction. The second direction and the first direction intersect. The power supply line in the first pixel driving circuit and the power supply line in the second pixel driving circuit are respectively connected to the third bridge through via holes.

In an exemplary embodiment of the present disclosure, the display panel further includes a light-shielding layer. The light-shielding layer is located between the first active layer and the base substrate. The orthographic projection on the base substrate of the light-shielding layer covers the orthographic projection of the second active portion on the base substrate.

In an exemplary embodiment of the present disclosure, the display panel further includes a fourth conductive layer. The fourth conductive layer is located on a side of the first conductive layer away from the base substrate. The fourth conductive layer includes a first bridge part. The first bridge part is connected to the third initial signal line and the tenth active portion through via holes respectively. The first bridge part in the first pixel driving circuit and the second bridge part in the second pixel driving circuit share a partial structure with each other, and are connected to the third initial signal line through the same via hole.

In an exemplary embodiment of the present disclosure, the pixel driving circuit is used to drive a light-emitting unit, and the pixel driving circuit further includes: a first transistor, a third transistor, a fourth transistor, a fifth transistor, a sixth transistor, a seventh transistor and a capacitor. The first terminal of the first transistor is connected to the data line, the second terminal of the first transistor is connected to the first terminal of the driving transistor, and the gate of the first transistor is connected to the first gate line. The first terminal of the third transistor is connected to the gate of the driving transistor, the second terminal of the third transistor is connected to the second terminal of the driving transistor, and the gate of the third transistor is connected to the second gate line. The first terminal of the fourth transistor is connected to the first initial signal line, the second terminal of the fourth transistor is connected to the gate of the driving transistor, and the gate of the fourth transistor is connected to the second reset signal line. The first terminal of the fifth transistor is connected to the power supply line, the second terminal of the fifth transistor is connected to the first terminal of the driving transistor, and the gate of the fifth transistor is connected to the enable signal line. The first terminal of the sixth transistor is connected to the second terminal of the driving transistor, the second terminal of the sixth transistor is connected to the first electrode of the light-emitting unit, and the gate of the sixth transistor is connected to the enable signal line. The first terminal of the seventh transistor is connected to the second initial signal line, the second terminal of the seventh transistor is connected to the second terminal of the sixth transistor, and the gate of the seventh transistor is connected to the first reset signal line. The capacitor is connected between the power supply line and the gate of the driving transistor. The driving transistor, the first transistor, the fifth transistor, the sixth transistor, the seventh transistor, and the eighth transistor are P-type transistors, and the third transistor and the fourth transistor are N-type transistors.

According to an aspect of the present disclosure, there is provided a display device including the above-mentioned display panel.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the specification, illustrate embodiments consistent with the present disclosure and together with the description serve to explain the principle of the present disclosure. Obviously, the drawings in the following description are only some embodiments of the present disclosure, and for those of ordinary skill in the art, other drawings may also be obtained from these drawings without creative effort.

BRIEF DESCRIPTION OF THE EMBODIMENTS

Figure 1:
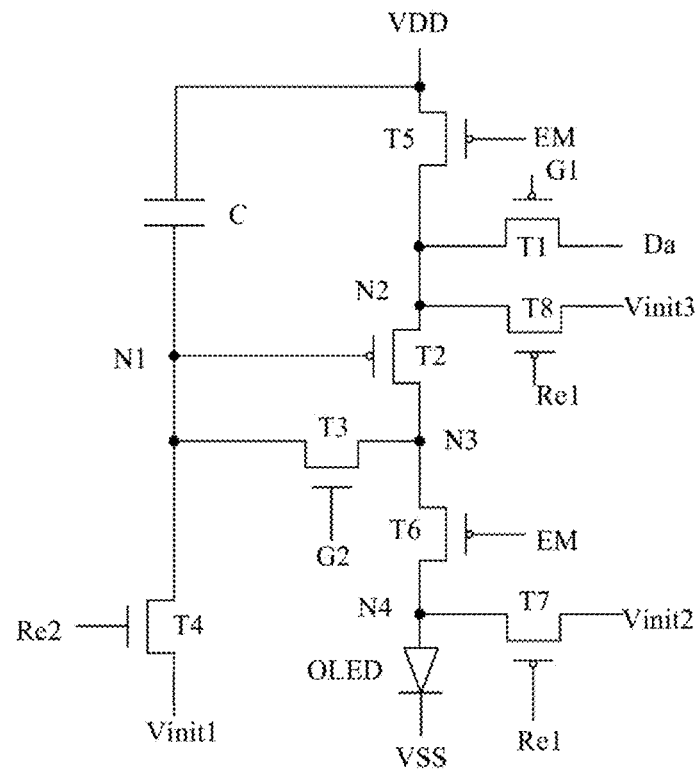
FIG. 1 is a schematic structural diagram of a pixel driving circuit in a display panel according to an exemplary embodiment of the present disclosure.

Example embodiments will now be described more fully with reference to the accompanying drawings. Example embodiments, however, may be embodied in various forms and should not be construed as limited to the examples set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted.

The terms "a", "an", "the" are used to indicate the presence of one or more elements or components, etc. The terms "including" and "having" are used to indicate an open-ended inclusive and mean that additional elements or components, etc. may be present in addition to the listed elements or components, etc.

As shown in FIG. 1, it is a schematic structural diagram of a pixel driving circuit in a display panel according to an exemplary embodiment of the present disclosure. The pixel driving circuit may include a first transistor T1, a driving transistor T2, a third transistor T3, a fourth transistor T4, a fifth transistor T5, a sixth transistor T6, a seventh transistor T7, an eighth transistor T8, and a capacitor C. The first terminal of the driving transistor T2 is connected to the second node N2, the second terminal of the driving transistor T2 is connected to the third node N3, and the gate of the driving transistor T2 is connected to the first node N1. The first terminal of the first transistor T1 is connected to the data signal terminal Da, the second terminal of the first transistor T1 is connected to the second node N2, and the gate of the first transistor T1 is connected to the first gate driving signal terminal G1. The first terminal of the third transistor T3 is connected to the first node N1, the second terminal of the third transistor T3 is connected to the third node N3, and the gate of the third transistor T3 is connected to the second gate driving signal terminal G2. The first terminal of the fourth transistor T4 is connected to the first initial signal terminal Vinit1, the second terminal of the fourth transistor T4 is connected to the first node N1, and the gate of the fourth transistor T4 is connected to the second reset signal terminal Re2. The first terminal of the fifth transistor T5 is connected to the first power supply terminal VDD, the second terminal of the fifth transistor T5 is connected to the second node N2, and the gate of the fifth transistor T5 is connected to the enable signal terminal EM. The first terminal of the sixth transistor T6 is connected to the third node N3, the second terminal of the sixth transistor T6 is connected to the fourth node N4, and the gate of the sixth transistor T6 is connected to the enable signal terminal EM. The first terminal of the seventh transistor T7 is connected to the second initial signal terminal Vinit2, the second terminal of the seventh transistor T7 is connected to the fourth node N4, and the gate of the seventh transistor T7 is connected to the first reset signal terminal Re1. The first terminal of the eighth transistor T8 is connected to the third initial signal terminal Vinit3, the second terminal of the eighth transistor T8 is connected to the second node N2, and the gate of the eighth transistor T8 is connected to the first reset signal terminal Re1. The second terminal of the seventh transistor T7 may be used to connect with the first electrode of the light-emitting unit OLED, and the other electrode of the light-emitting unit OLED may be used to connect with the second power supply terminal VSS. The first transistor T1, the driving transistor T2, the fifth transistor T5, the sixth transistor T6, the seventh transistor T7, and the eighth transistor T8 may be P-type transistors. The third transistor T3 and the fourth transistor T4 may be N-type transistors. In addition, in other exemplary embodiments, the third initial signal terminal may also reuse stable signal terminals such as the first initial signal terminal, the second initial signal terminal, the first power supply terminal, and the second power supply terminal. When the third initial signal terminal Vinit3 reuses the first power supply terminal VDD, the voltage of the third initial signal terminal Vinit3 may be 0.5 times to 1.5 times the voltage of the first power supply terminal VDD. For example, the voltage of the third initial signal terminal Vinit3 may be 0.5 times, 1 times, 1.5 times, etc. of the voltage of the first power supply terminal VDD.

Figure 2:
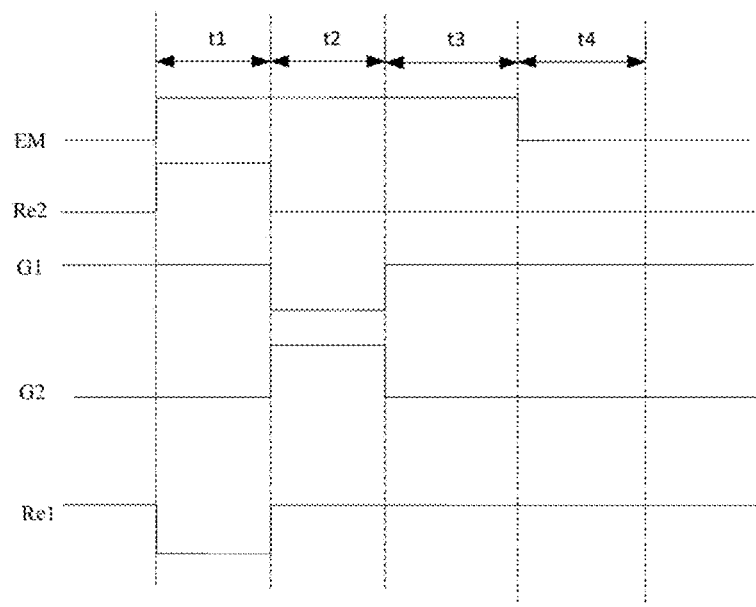
FIG. 2 is a timing diagram of each node in a driving method of the pixel driving circuit in FIG. 1.

As shown in FIG. 2, it is a timing diagram of each node in a driving method of the pixel driving circuit in FIG. 1. G1 represents the timing of the first gate driving signal terminal, G2 represents the timing of the second gate driving signal terminal, Re1 represents the timing of the first reset signal terminal, Re2 represents the timing of the second reset signal terminal, and EM represents the timing of the enable signal terminal. The driving method of the pixel driving circuit may include four stages: a reset stage t1, a threshold compensation stage t2, a buffer stage t3, and a light-emitting stage t4. In the reset stage t1, the enable signal terminal EM, the second reset signal terminal Re2, and the first gate driving signal terminal G1 output high-level signals; the second gate driving signal terminal G2 and the first reset signal terminal Re1 output low-level signals; the fourth transistor T4, the seventh transistor T7, and the eighth transistor T8 are turned on; the first initial signal terminal Vinit1 inputs the first initial signal to the first node N1; the third initial signal terminal Vinit3 inputs the third initial signal to the second node N2; and the second initial signal terminal Vinit2 inputs the second initial signal to the fourth node. In the threshold compensation stage t2, the enable signal terminal EM, the second gate driving signal terminal G2 and the first reset signal terminal Re1 output high-level signals; the second reset signal terminal Re2 and the first gate driving signal terminal G1 output low-level signals; the third transistor T3 and the first transistor T1 are turned on; and the data signal terminal Da writes the compensation voltage Vdata+Vth to the first node N1, where Vdata is the voltage of the data signal terminal, and Vth is the threshold voltage of the driving transistor. In the buffering stage t3, the enable signal terminal EM, the first reset signal terminal Re1, and the first gate driving signal terminal G1 output high-level signals; the second gate driving signal terminal G2 and the second reset signal terminal Re2 output low-level signals; and all transistors are turned off. In the light-emitting stage t4, the first reset signal terminal Re1 and the first gate driving signal terminal G1 output high-level signals; the enable signal terminal EM, the second gate driving signal terminal G2 and the second reset signal terminal Re2 output low-level signals; the fifth transistor T5 and the sixth transistor T6 are turned on; and the driving transistor T2 emits light under the effect of the voltage Vdata+Vth stored in the capacitor C. It should be understood that, in other exemplary embodiments, the driving method may not include the buffer stage; and the fourth transistor T4 and the seventh transistor T7 may also be turned on in different stages. In the threshold compensation stage t2, the duration of the active level (low level) of the first gate driving signal terminal G1 may be shorter than the duration of the active level (high level) of the second gate driving signal terminal G2. In the threshold compensation stage t2, the first gate driving signal terminal G1 may scan one row of pixel driving circuits, and the second gate driving signal terminal G2 may scan multiple rows of pixel driving circuits row by row, for example, two rows of pixel driving circuits.

In the related art, the pixel driving circuit does not have the eighth transistor, and a parasitic capacitance exists between the gate and the source of the driving transistor in the pixel driving circuit. During the reset phase of the pixel driving circuit, the gate voltage of the driving transistor is initialized to be the initial voltage. Under the coupling effect of the above-mentioned parasitic capacitance, the source voltage of the driving transistor also changes accordingly. When different gray scales are reset in the reset stage, the gate voltage of the driving transistor changes in different amounts, and thus the change amount in the source voltage of the driving transistor is also different. This in turn causes the gate-source voltage difference (Vgs) of the driving transistor to be different after the reset stage is completed. At the same time, since the Vgs of the driving transistor will affect its threshold voltage, the display panel will have residual image. In an exemplary embodiment, the pixel driving circuit may use the fourth transistor T4 to reset the first node N1 and use the eighth transistor T8 to reset the second node N2 during the reset stage. Thus, with different data signals, the pixel driving circuit may reset the gate-source voltage difference of the driving transistor to be the same value, thereby improving problems such as residual image of the display panel.

Figure 3:
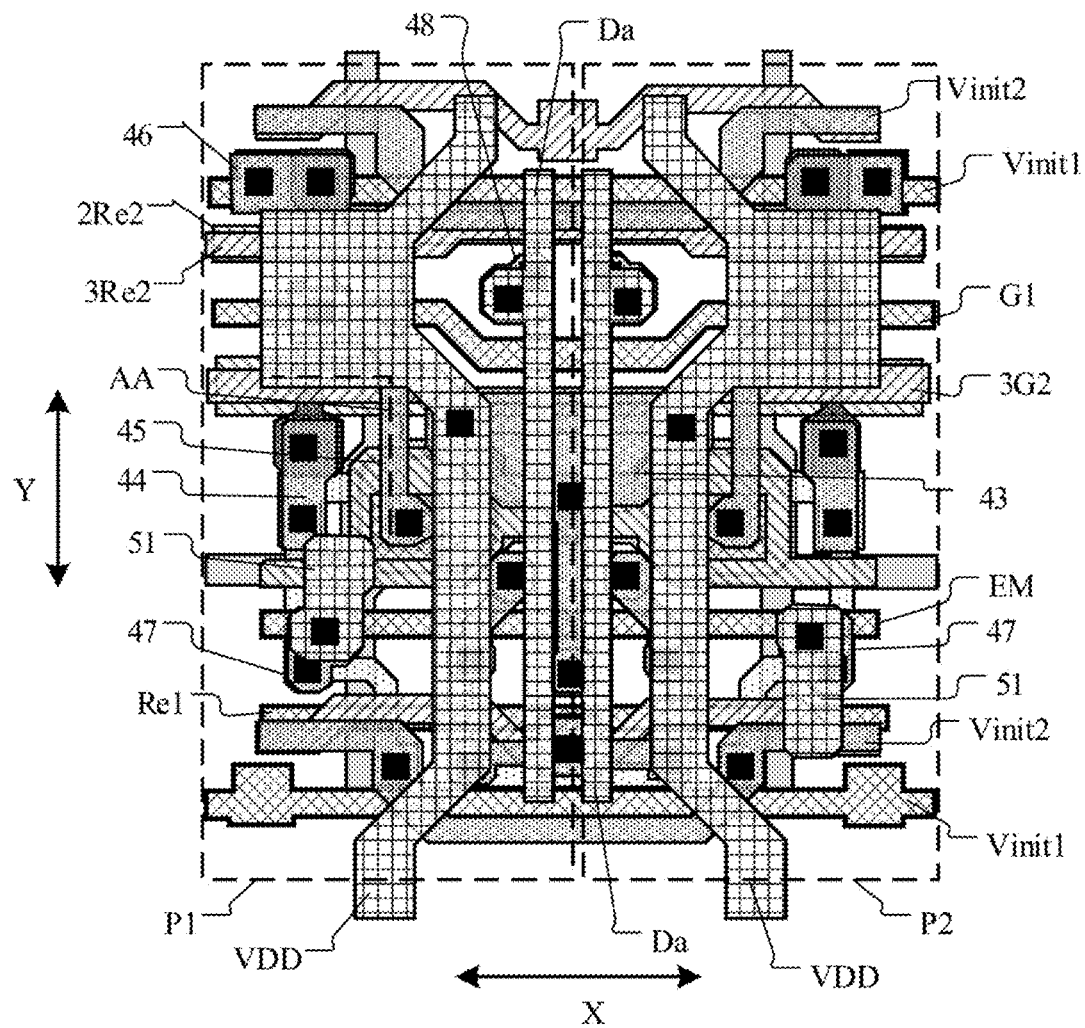
FIG. 3 is a structural layout of a display panel according to an exemplary embodiment of the present disclosure.
Figure 4:
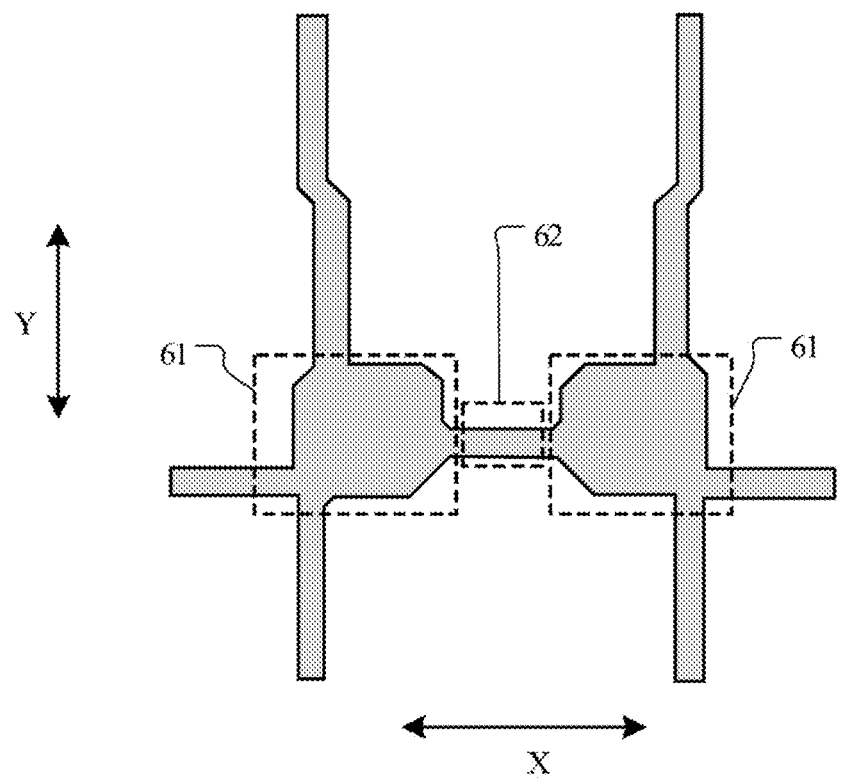
FIG. 4 is a structural layout of the light-shielding layer in FIG. 3.
Figure 5:
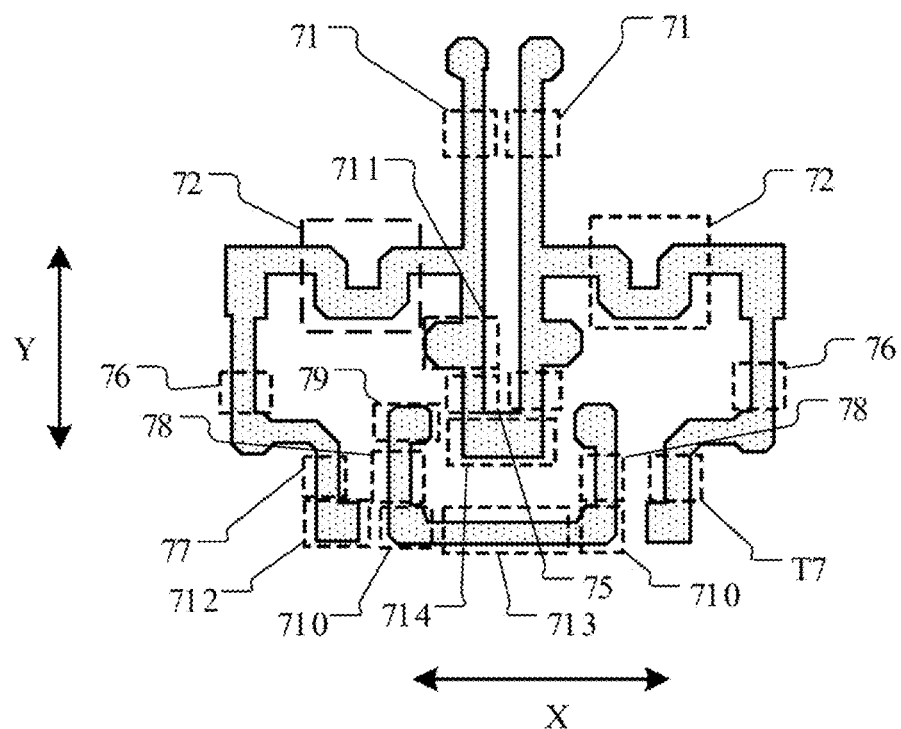
FIG. 5 is a structural layout of the first active layer in FIG. 3.
Figure 6:
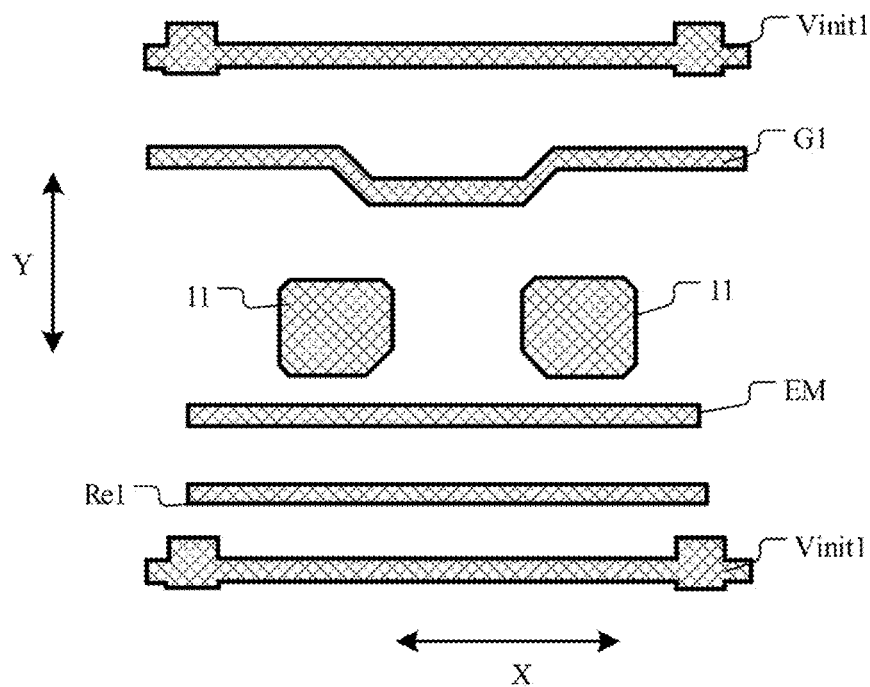
FIG. 6 is a structural layout of the first conductive layer in FIG. 3.
Figure 7:
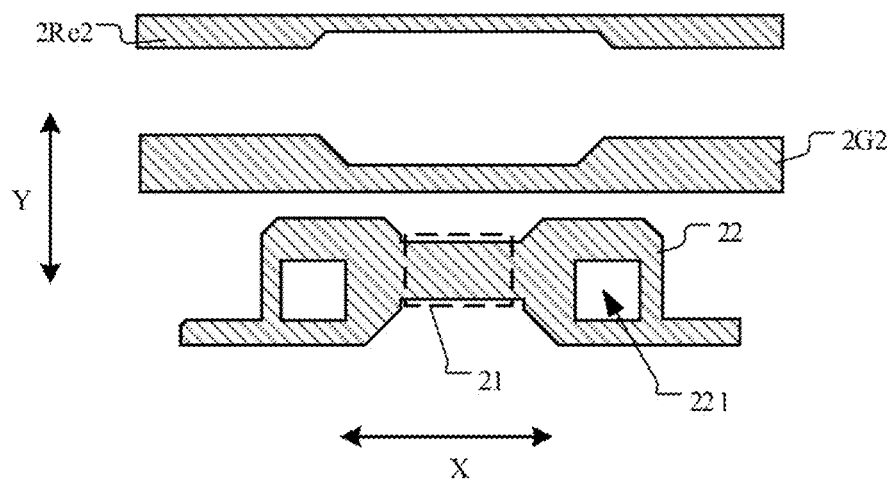
FIG. 7 is a structural layout of the second conductive layer in FIG. 3.
Figure 8:
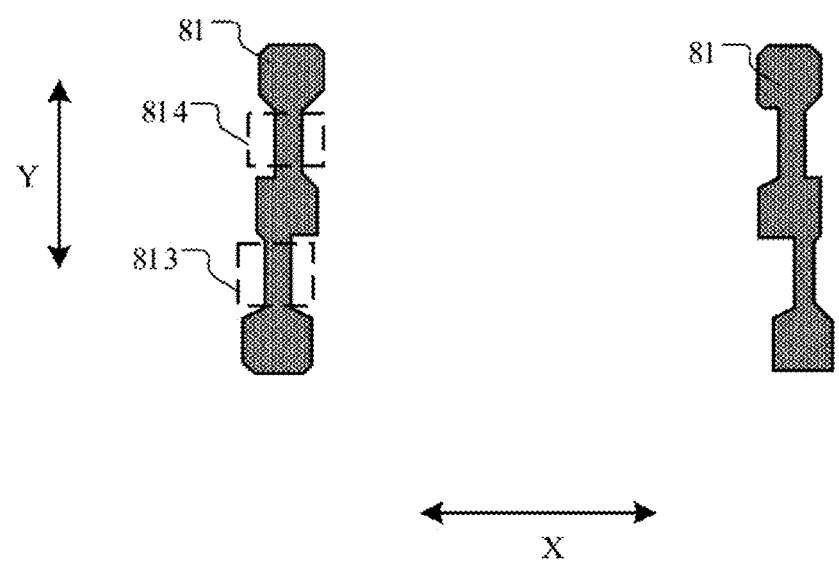
FIG. 8 is a structural layout of the second active layer in FIG. 3.
Figure 9:
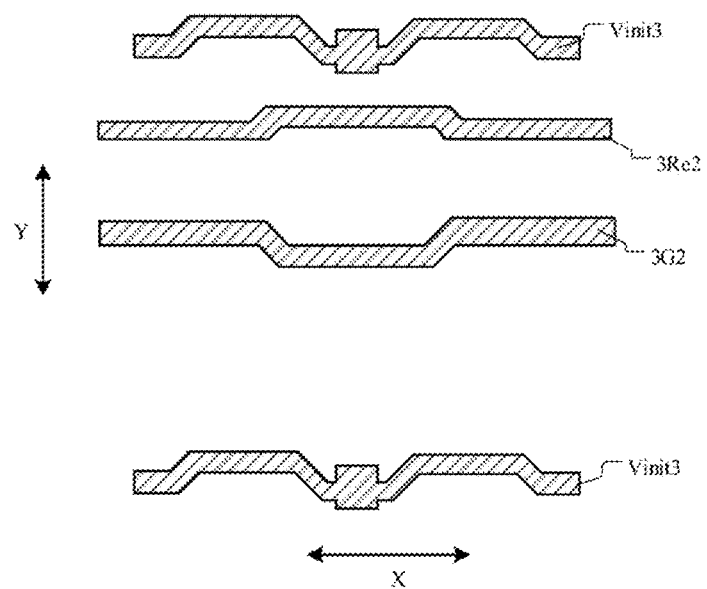
FIG. 9 is a structural layout of the third conductive layer in FIG. 3.
Figure 10:
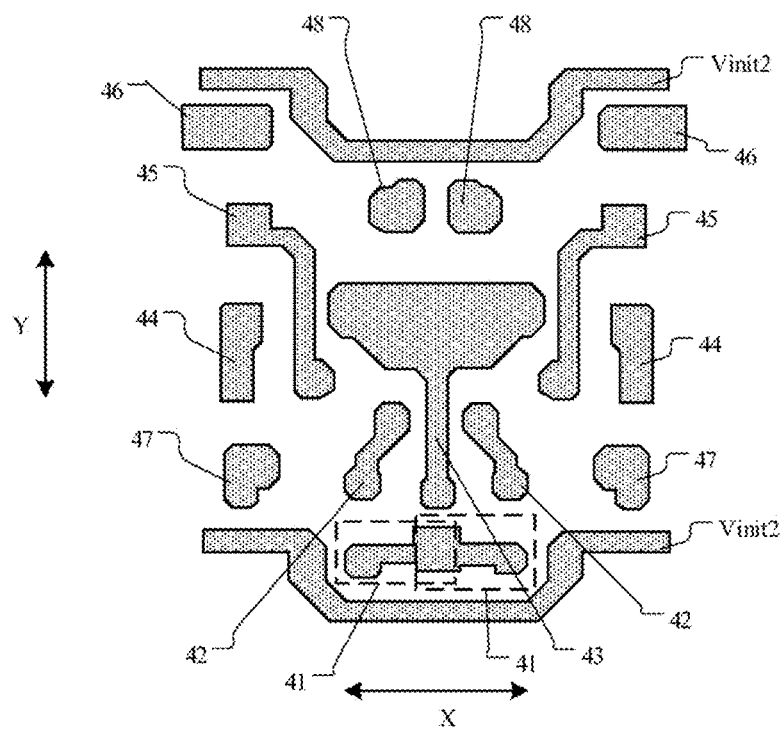
FIG. 10 is a structural layout of the fourth conductive layer in FIG. 3.
Figure 11:
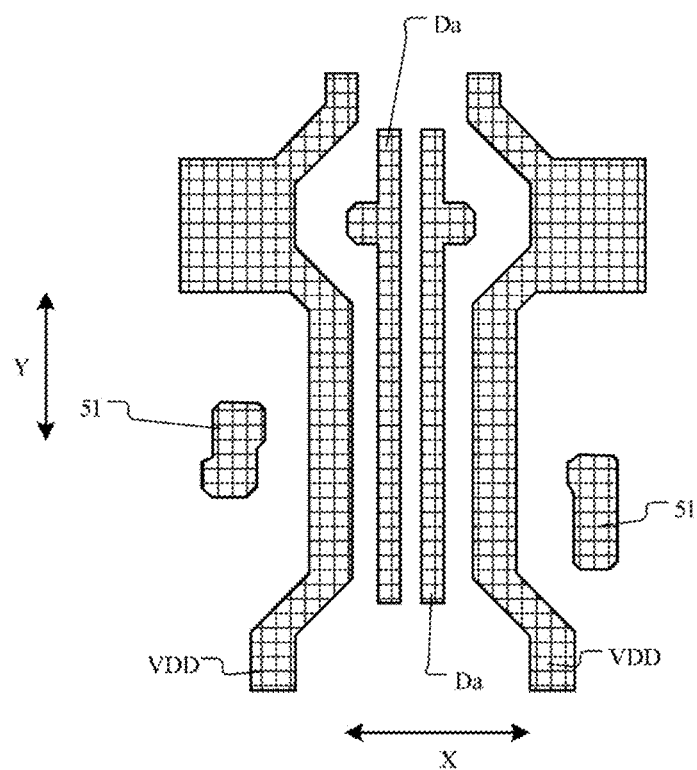
FIG. 11 is a structural layout of the fifth conductive layer in FIG. 3.
Figure 12:
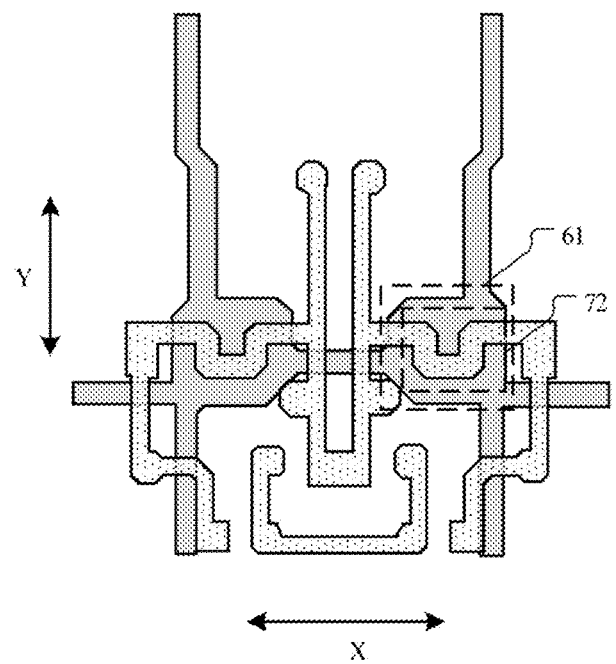
FIG. 12 is a structural layout of the light-shielding layer and the first active layer in FIG. 3.
Figure 13:
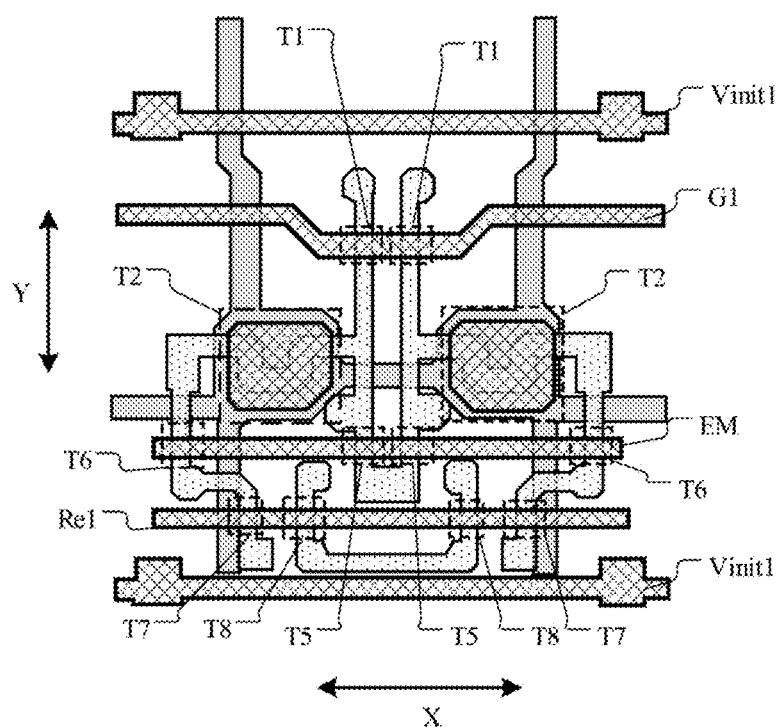
FIG. 13 is a structural layout of the light-shielding layer, the first active layer, and the first conductive layer in FIG. 3.
Figure 14:
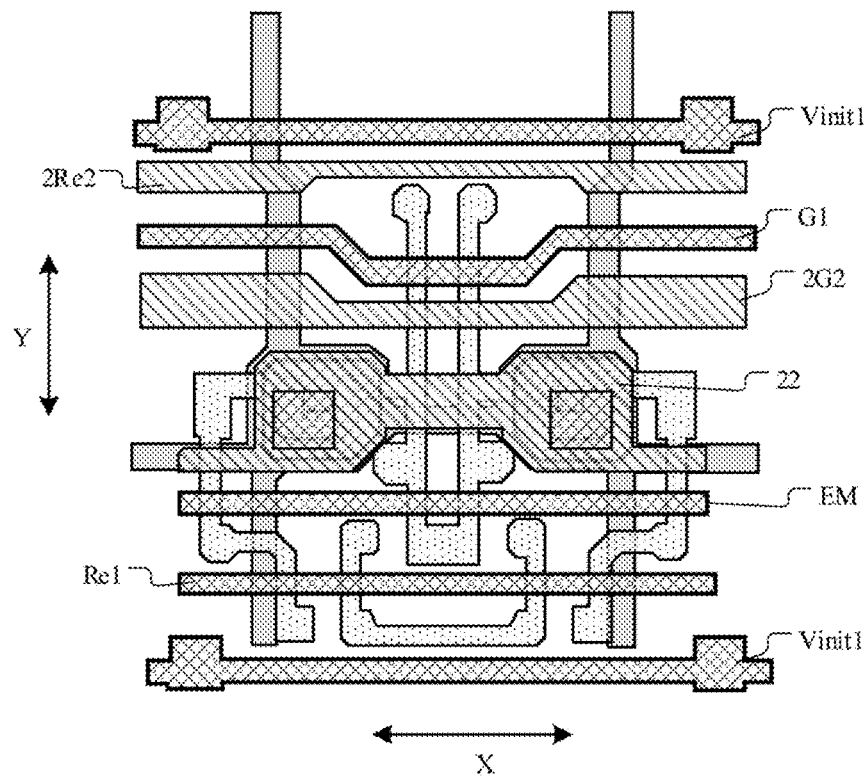
FIG. 14 is a structural layout of the light-shielding layer, the first active layer, the first conductive layer, and the second conductive layer in FIG. 3.
Figure 15:
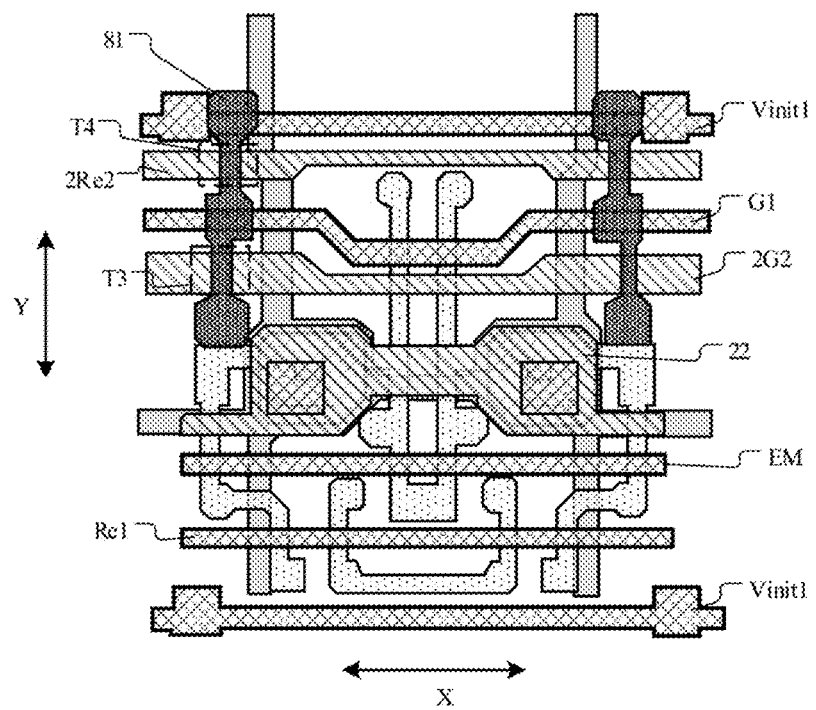
FIG. 15 is a structural layout of the light-shielding layer, the first active layer, the first conductive layer, the second conductive layer, and the second active layer in FIG. 3.
Figure 16:
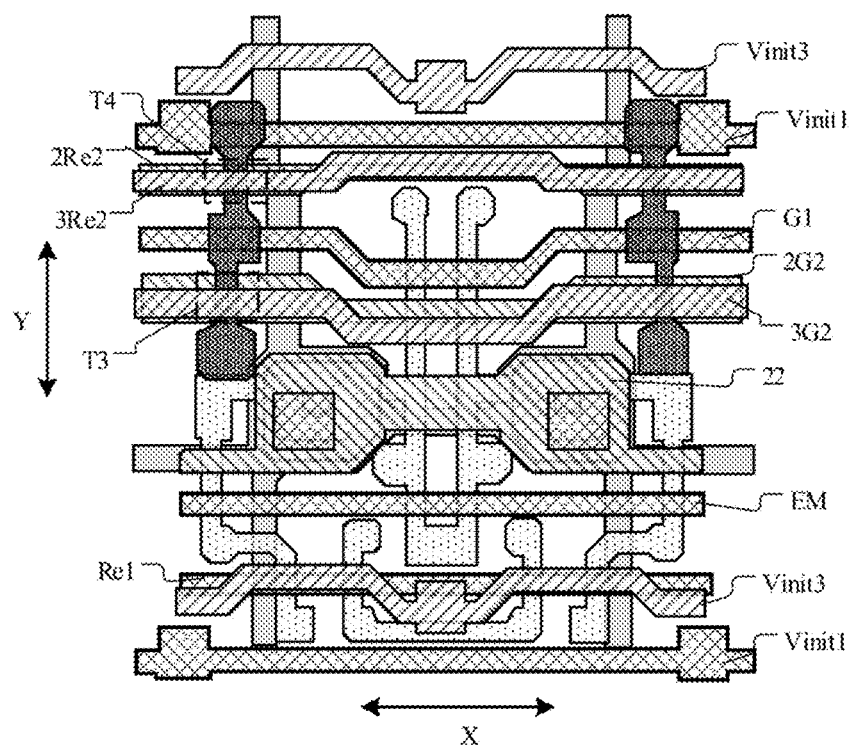
FIG. 16 is a structural layout of the light-shielding layer, the first active layer, the first conductive layer, the second conductive layer, the second active layer, and the third conductive layer in FIG. 3.
Figure 17:
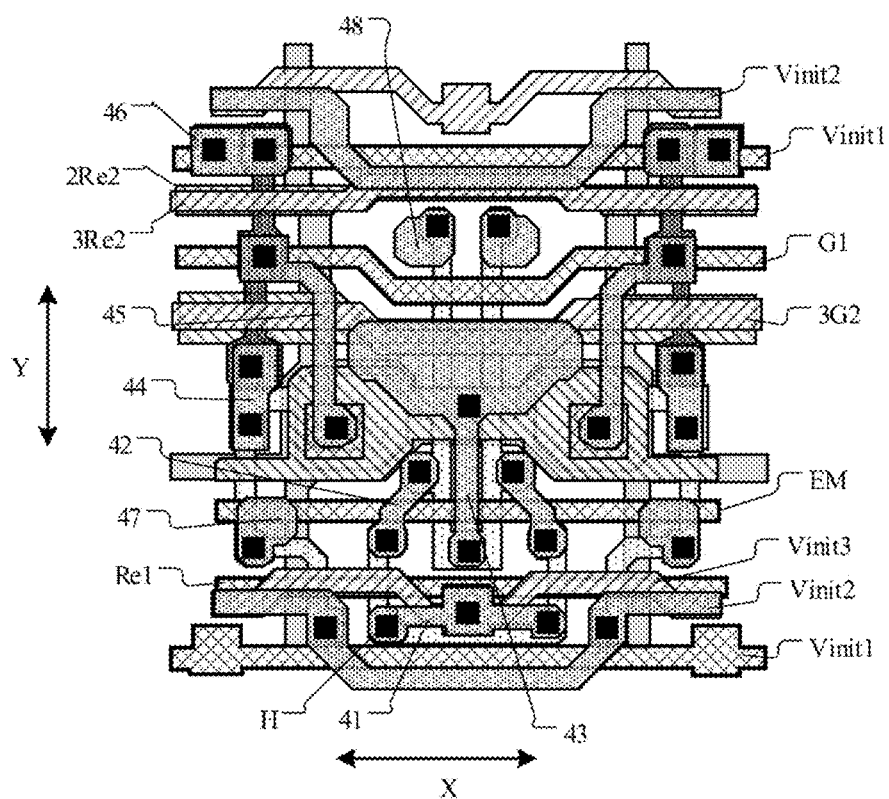
FIG. 17 is a structural layout of the light-shielding layer, the first active layer, the first conductive layer, the second conductive layer, the second active layer, the third conductive layer, and the fourth conductive layer in FIG. 3.

In an exemplary embodiment, the display panel may further include a base substrate, a light-shielding layer, a first active layer, a first conductive layer, a second conductive layer, a second active layer, a third conductive layer, a fourth conductive layer, and a fifth conductive layer that are stacked in sequence. Besides, an insulation layer may be provided between the above-mentioned layers. As shown in FIGS. 3-17, FIG. 3 is a structural layout of a display panel according to an exemplary embodiment of the present disclosure; FIG. 4 is a structural layout of the light-shielding layer in FIG. 3; FIG. 5 is a structural layout of the first active layer in FIG. 3; FIG. 6 is a structural layout of the first conductive layer in FIG. 3; FIG. 7 is a structural layout of the second conductive layer in FIG. 3; FIG. 8 is a structural layout of the second active layer in FIG. 3; FIG. 9 is a structural layout of the third conductive layer in FIG. 3; FIG. 10 is a structural layout of the fourth conductive layer in FIG. 3; FIG. 11 is a structural layout of the fifth conductive layer in FIG. 3; FIG. 12 is a structural layout of the light-shielding layer and the first active layer in FIG. 3; FIG. 13 is a structure layout of the light-shielding layer, the first active layer, and the first conductive layer in FIG. 3; FIG. 14 is a structure layout of the light-shielding layer, the first active layer, the first conductive layer, and the second conductive layer in FIG. 3; FIG. 15 is a structure layout of the light-shielding layer, the first active layer, the first conductive layer, the second conductive layer, and the second active layer in FIG. 3; FIG. 16 is a structural layout of the light-shielding layer, the first active layer, the first conductive layer, the second conductive layer, the second active layer, and the third conductive layer in FIG. 3; and FIG. 17 is a structural layout of the light-shielding layer, the first active layer, the first conductive layer, the second conductive layer, the second active layer, the third conductive layer, and the fourth conductive layer in FIG. 3. The display panel may include a plurality of pixel driving circuits shown in FIG. 1. As shown in FIG. 3, the plurality of pixel driving circuits may include a first pixel driving circuit P1 and a second pixel driving circuit P2 which are adjacently arranged in the first direction X. The first pixel driving circuit P1 and the second pixel driving circuit P2 may be mirror-symmetrical with each other. Meanwhile, the display panel may include a plurality of repeating units as shown in FIG. 3, and the plurality of repeating units may be arranged in an array.

As shown in FIGS. 3, 4 and 12, the light-shielding layer may include two light-shielding portions 61 arranged in the first direction X, and a connection part 62 connected between the light-shielding portions 61. The light-shielding layer may be a conductor structure. For example, the light-shielding layer may be a light-shielding metal layer.

As shown in FIGS. 3, 5, 12 and 13, the first active layer may include a first active portion 71, a second active portion 72, a fifth active portion 75, a sixth active portion 76, a seventh active portion 77, an eighth active portion 78, a ninth active portion 79, a tenth active portion 710, an eleventh active portion 711, a twelfth active portion 712, a thirteenth active portion 713, and a fourteen active portions 714. The first active portion 71 may be used to form the channel region of the first transistor T1. The second active portion 72 may be used to form the channel region of the driving transistor T2. The fifth active portion 75 may be used to form the channel region of the fifth transistor T5. The sixth active portion 76 may be used to form the channel region of the sixth transistor. The seventh active portion 77 may be used to form the channel region of the seventh transistor T7. The eighth active portion 78 may be used to form the channel region of the eighth transistor T8. The ninth active portion 79 and the tenth active portion 710 are respectively connected to both sides of the eighth active portion 78. The eleventh active portion 711 is connected to one side of the second active portion 72. The twelfth active portion 712 is connected to a side of the seventh active portion 77 away from the sixth active portion 76. The thirteenth active portion 713 is connected between the tenth active portion 710 in the first pixel driving circuit P1 and the tenth active portion 710 in the second pixel driving circuit P2. The fourteenth active portion 714 is connected between the fifth active portion 75 in the first pixel driving circuit P1 and the fifth active portion 75 in the second pixel driving circuit P2. The first active layer may be formed of polysilicon. Accordingly, the first transistor T1, the driving transistor T2, the fifth transistor T5, the sixth transistor T6, the seventh transistor T7, and the eighth transistor T8 may be P-type low-temperature polysilicon thin film transistors. As shown in FIG. 12, the orthographic projection of the light-shielding portion 61 on the base substrate may cover the orthographic projection of the second active portion 72 on the base substrate. The light-shielding portion 61 may shield the second active portion 72 from light. Thus, the influence of light on the characteristics of the driving transistor T2 is reduced.

As shown in FIGS. 3, 6 and 13, the first conductive layer may include a first initial signal line Vinit1, a first gate line G1, a first conductive portion 11, an enable signal line EM, and a first reset signal line Re1. The orthographic projection of the first initial signal line Vinit1 on the base substrate, the orthographic projection of the first gate line G1 on the base substrate, the orthographic projection of the enable signal line EM on the base substrate, and the orthographic projection of the first reset signal line Re1 on the base substrate may all extend along the first direction X. The first initial signal line Vinit1 may be used to provide the first initial signal terminal in FIG. 1. The orthographic projection of the first gate line G1 on the base substrate covers the orthographic projection of the first active portion 71 on the base substrate, and a partial structure of the first gate line G1 may be used to form the gate of the first transistor. The enable signal line EM may be used to provide the enable signal terminal in FIG. 1. The orthographic projection of the enable signal line EM on the base substrate may cover the orthographic projection of the fifth active portion 75 on the base substrate, and the orthographic projection of the sixth active portion 76 on the base substrate. A partial structure of the enable signal line EM may be used to form the gate of the fifth transistor and the gate of the sixth transistor, respectively. The first reset signal line Re1 may be used to provide the first reset signal terminal in FIG. 1. The orthographic projection of the first reset signal line Re1 on the base substrate may cover the orthographic projection of the seventh active portion 77 on the base substrate and the orthographic projection of the eighth active portion 78 on the base substrate. A partial structure of the first reset signal line Re1 may be used to form the gate of the seventh transistor and the gate of the eighth transistor, respectively. The orthographic projection of the first conductive portion 11 on the base substrate may cover the orthographic projection of the second active portion 72 on the base substrate, and the first conductive portion 11 may be used to form the gate of the driving transistor T2 and the first electrode of the capacitor C. The light-shielding layer may be connected to a stable power supply terminal, for example, the first power supply terminal, the first initial signal terminal, the second initial signal terminal, the third initial signal terminal, etc. in FIG. 1. The light-shielding layer may be connected to the stable voltage terminals of other conductive layers through via holes located at the periphery of the display area of the display panel. For example, the light-shielding layer may be connected to the power supply lines of the fifth conductive layer through via holes located at the periphery of the display area of the display panel. The light-shielding portion 61 helps to stabilize the voltage of the first conductive portion 11, thereby reducing the voltage fluctuation of the gate of the driving transistor T2 during the light-emitting stage. As shown in FIGS. 6 and 13, the orthographic projection of the enable signal line EM on the base substrate may be located between the orthographic projection of the eleventh active portion 711 on the base substrate and the orthographic projection of the ninth active portion 79 on the base substrate. The orthographic projection of the ninth active portion 79 on the base substrate is located between the orthographic projection of the first reset signal line Re1 on the base substrate and the orthographic projection of the enable signal line EM on the base substrate. In addition, the display panel may use the first conductive layer as a mask to conduct conductive treatment on the first active layer. That is, the area covered by the first conductive layer in the first active layer may form the channel region of the transistor, and the area not covered by the first conductive layer forms a conductor structure. In addition, in an exemplary embodiment, the expression of the orthographic projection of a structure on the base substrate extending along a certain direction may be understood as that the entire orthographic projection of the structure on the base substrate extends along such direction. That is, the orthographic projection of the structure on the base substrate may extend straight or bent in such direction.

As shown in FIGS. 3, 7, and 14, the second conductive layer may include a third gate line 2G2, a third reset signal line 2Re2, a second conductive portion 22, and a first connection part 21. The third gate line 2G2 may be used for providing the second gate driving signal terminal in FIG. 1, and the third reset signal line 2Re2 may be used for providing the second reset signal terminal in FIG. 1. Both the orthographic projection of the third gate line 2G2 on the base substrate and the orthographic projection of the third reset signal line 2Re2 on the base substrate may extend along the first direction X. The orthographic projection of the second conductive portion 22 on the base substrate may at least partially overlap with the orthographic projection of the first conductive portion on the base substrate. The second conductive portion 22 may be used to form the second electrode of the capacitor. The first connection part 21 may be connected between adjacent second conductive portions 22. Among the plurality of repeating units arranged at intervals in the first direction X, the second conductive portions 22 may be sequentially connected to each other. An opening 221 may be provided in the second conductive portion 22.

As shown in FIGS. 3, 8 and 15, the second active layer may include an active portion 81, and the active portion 81 may include a third active portion 813 and a fourth active portion 814. The third active portion 813 may be used for forming the channel region of the third transistor T3, and the fourth active portion 814 may be used for forming the channel region of the fourth transistor T4. The orthographic projection of the third reset signal line 2Re2 on the base substrate may cover the orthographic projection of the fourth active portion 814 on the base substrate. A partial structure of the third reset signal line 2Re2 may be used to form the bottom gate of the fourth transistor T4. The orthographic projection of the third gate line 2G2 on the base substrate may cover the orthographic projection of the third active portion 813 on the base substrate. A partial structure of the third gate line 2G2 may be used to form the bottom gate of the third transistor T3. The second active layer may be formed of indium gallium zinc oxide. Accordingly, the third transistor and the fourth transistor may be N-type oxide thin film transistors.

As shown in FIGS. 3, 9 and 16, the third conductive layer may include a third initial signal line Vinit3, a second reset signal line 3Re2, and a second gate line 3G2. The orthographic projection of the third initial signal line Vinit3 on the base substrate, the orthographic projection of the second reset signal line 3Re2 on the base substrate, and the orthographic projection of the second gate line 3G2 on the base substrate may all extend along the first direction X. The third initial signal line Vinit3 may be used to provide the third initial signal terminal in FIG. 1. The second reset signal line 3Re2 may be used to provide the second reset signal terminal in FIG. 1. The second reset signal line 3Re2 may be connected to the third reset signal line 2Re2 through a via hole. The via hole connected to the second reset signal line 3Re2 and the third reset signal line 2Re2 may be located in the edge wiring area of the display panel. The orthographic projection of the second reset signal line 3Re2 on the base substrate may cover the orthographic projection of the fourth active portion 814 on the base substrate. A partial structure of the second reset signal line 3Re2 may be used to form the top gate of the fourth transistor T4. The second gate line 3G2 may be used to provide the second gate driving signal terminal in FIG. 1. The second gate line 3G2 may be connected to the third gate line 2G2 through a via hole. The via hole connected to the second gate line 3G2 and the third gate line 2G2 may be located in the edge wiring area of the display panel. The orthographic projection of the second gate line 3G2 on the base substrate may cover the orthographic projection of the third active portion 813 on the base substrate. A partial structure of the second gate line 3G2 may be used to form the top gate of the third transistor T3.

As shown in FIGS. 3 and 16, the orthographic projection on the base substrate of the third initial signal line Vinit3 may at least partially overlap with the orthographic projection of the first reset signal line Re1 on the base substrate. This setting helps to improve the integration degree of the pixel driving circuit and reduce the layout area of the pixel driving circuit. The orthographic projection of the second reset signal line 3Re2 on the base substrate may be located at a side of the orthographic projection of the second gate line 3G2 on the base substrate away from the orthographic projection of the first conductive portion 11 on the base substrate. The orthographic projection of the first gate line G1 on the base substrate may be located between the orthographic projection of the second gate line 3G2 on the base substrate and the orthographic projection of the second reset signal line 3Re2 on the base substrate. In addition, the display panel may use the third conductive layer as a mask to conduct conducting treatment on the second active layer. That is, the area covered by the third conductive layer in the second active layer may form the channel region of the transistor, and the area not covered by the third conductive layer forms a conductor structure.

As shown in FIGS. 3, 10 and 17, the fourth conductive layer may include a second initial signal line Vinit2, a first bridge part 41, a second bridge part 42, a third bridge part 43, a fourth bridge part 44, a fifth bridge part part 45, a sixth bridge part 46, a seventh bridge part 47, and an eighth bridge part 48. The orthographic projection of the second initial signal line Vinit2 on the base substrate may extend along the first direction X. The second initial signal line Vinit2 may be used to provide the second initial signal terminal in FIG. 1. The first bridge part 41 may be connected to the tenth active portion 710 and the third initial signal line Vinit3 through via holes H respectively, such that the first terminal of the eighth transistor T8 is connected to the third initial signal terminal. The first bridge part 41 in the first pixel driving circuit P1 and the first bridge part 41 in the second pixel driving circuit share a partial structure with each other, and share the same via hole to connect with the third initial signal line Vinit3. It should be noted that, the black squares in an exemplary embodiment represent via holes, and an exemplary embodiment only annotates positions of some of the via holes. The second bridge part 42 may be connected to the tenth active portion 710 and the eleventh active portion 711 through via holes, respectively, such that the second terminal of the eighth transistor T8 and the first terminal of the driving transistor T2 are connected. The third bridge part 43 may be connected to the fourteenth active portion 714 and the first connection part 21 through via holes, respectively, so that the second electrode of the capacitor and the first terminal of the fifth transistor are connected. The third bridge part 43 may be mirror-symmetrical in a mirror symmetry plane of the first pixel driving circuit P1 and the second pixel driving circuit P2. The fourth bridge part 44 may be connected to the first active layer between the sixth active portion 76 and the second active portion 72, and the second active layer located at a side of the third active portion 813 away from the fourth active portion 814, through via holes respectively, such that the second terminal of the driving transistor T2, the second terminal of the third transistor T3, and the first terminal of the sixth transistor T6 are connected. The fifth bridge part 45 may be respectively connected to the second active layer between the third active portion 813 and the fourth active portion 814, as well as the first conductive portion 11, through via holes respectively, such that the first terminal of the third transistor T3, the second terminal of the fourth transistor T4, and the gate of the driving transistor T2 are connected. The orthographic projection on the base substrate of the via hole connected between the fifth bridge part 55 and the first conductive portion 11 is located within the orthographic projection of the opening 221 on the base substrate, so as to prevent the conductive structure in the via hole from being electrically connected to the second conductive portion 22. The sixth bridge part 46 may be respectively connected to the second active layer at a side of the fourth active portion 814 away from the third active portion 813, as well as the first initial signal line Vinit1, through via holes respectively, such that the first terminal of the fourth transistor T4 and the first initial signal terminal are connected. The seventh bridge part 47 may be connected to the first active layer between the sixth active portion 76 and the seventh active portion 77 through a via hole, so as to connect with the second terminal of the seventh transistor. The seventh bridge part 47 may be used for connecting with the first electrode of the light-emitting unit. The eighth bridge part 48 may be connected to the first active layer at a side of the first active portion 71 away from the second active portion 72 through a via hole, so as to connect with the first terminal of the first transistor. The display panel may further include a plurality of pixel driving circuits arranged in an array along the first direction X and the second direction Y. The first direction X and the second direction Y may intersect with each other. For example, the first direction X may be a row direction, and the second direction Y may be a column direction. The orthographic projection on the base substrate of the first initial signal line Vinit1 in the pixel driving circuit of one row may at least partially overlap with the orthographic projection on the base substrate of the second initial signal line Vinit2 in the pixel driving circuit of the previous row. This arrangement helps to improve the integration degree of the pixel driving circuit and reduce the layout area of the pixel driving circuit.

In other exemplary embodiments, when the third initial signal terminal Vinit3 reuses the first power supply terminal VDD, as shown in FIGS. 3 and 17, the power supply line VDD may be directly connected to the first bridge part 41 through a via hole, so that the first terminal of the eighth transistor and the first power supply terminal VDD are connected. The position of the via hole connected between the power supply line VDD and the first bridge part 41 may be located at the position of the via hole originally connected between the third initial signal line Vinit3 and the first bridge part 41. At this time, the display panel may keep the third initial signal line Vinit3 or remove the third initial signal line Vinit3.

As shown in FIGS. 3 and 11, the fifth conductive layer may include a power supply line VDD, a data line Da, and a bridge part 51. The power supply line VDD may be used to provide the first power supply terminal in FIG. 1, and the data line Da may be used to provide the data signal terminal in FIG. 1. The orthographic projection of the power supply line VDD on the base substrate and the orthographic projection of the data line Da on the base substrate may both extend along the second direction Y. The data line Da may be connected to the eighth bridge part 48 through a via hole to connect with the first terminal of the first transistor. The power supply line VDD in the first pixel driving circuit and the power supply line VDD in the second pixel driving circuit are respectively connected to the third bridge part 43 through via holes, so as to connect with the first power supply terminal, the second electrode of the capacitor C, and the first terminal of the fifth transistor T5. The bridge part 51 may be connected to the seventh bridge part 47 through a via hole, and the bridge part 51 may be used to connect with the first electrode of the light-emitting unit. The second conductive portion 22 and the power supply line VDD connected in the first direction X may form a grid structure, thereby reducing the IR loading of the power supply line. As shown in FIG. 3, the orthographic projection of the power supply line VDD on the base substrate may also cover the orthographic projection of the fourth active portion 814 on the base substrate, so as to reduce the influence of illumination on the characteristics of the fourth transistor T4. At the same time, the orthographic projection of the power supply line VDD on the base substrate may at least partially overlap with the orthographic projection of the third active portion 813 on the base substrate. Similarly, the power supply line VDD may reduce the influence of illumination on the characteristics of the third transistor T3.

Figure 18:
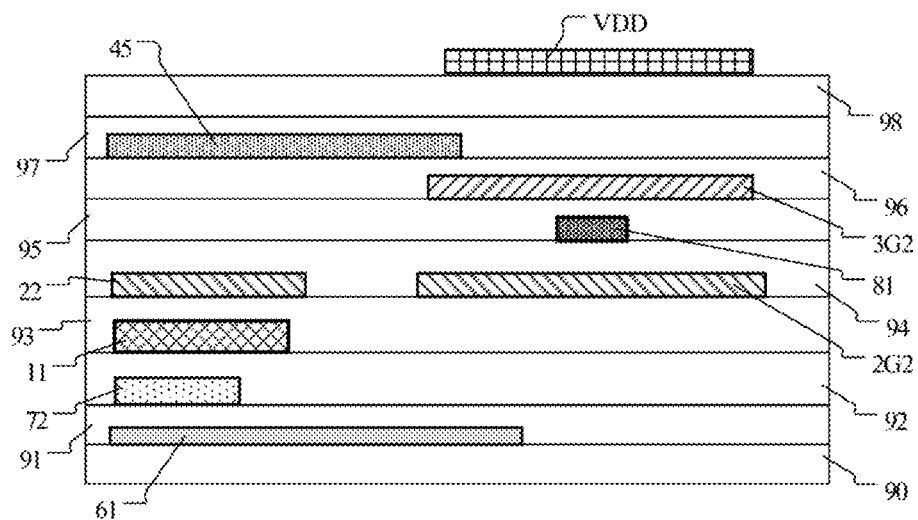
FIG. 18 is a partial cross-sectional view along the dotted line AA in FIG. 3.

As shown in FIG. 18, it is a partial cross-sectional view taken along the dotted line AA in FIG. 3. The display panel may further include a first insulation layer 91, a second insulation layer 92, a third insulation layer 93, a fourth insulation layer 94, a fifth insulation layer 95, a dielectric layer 96, a passivation layer 97, and a planarization layer 98, The base substrate 90, the light-shielding layer, the first insulation layer 91, the first active layer, the second insulation layer 92, the first conductive layer, the third insulation layer 93, the second conductive layer, the fourth insulation layer 94, the second active layer, the fifth insulation layer 95, the third conductive layer, the dielectric layer 96, the fourth conductive layer, the passivation layer 97, the planarization layer 98, and the fifth conductive layer are stacked in sequence. The first insulation layer 91, the second insulation layer 92, the third insulation layer 93, the fourth insulation layer 94, and the fifth insulation layer 95 may be silicon oxide layers. The dielectric layer 96 and the passivation layer 97 may be silicon nitride layers. The material of the planarization layer 98 may be an organic material, such as polyimide (PI), polyethylene terephthalate (PET), polyethylene naphthalate (PEN), silicon-glass bonding structure (SOG), and other materials. The base substrate 90 may include a glass substrate, a barrier layer, and a polyimide layer stacked in sequence. The barrier layer may be an inorganic material. The materials of the first conductive layer, the second conductive layer, and the third conductive layer may be one of molybdenum, aluminum, copper, titanium, and niobium, or an alloy thereof, or a molybdenum/titanium alloy or laminate. The materials of the fourth conductive layer and the fifth conductive layer may include metal materials, such as one of molybdenum, aluminum, copper, titanium, and niobium, or an alloy thereof, or a molybdenum/titanium alloy or laminate, or may be a titanium/aluminum/titanium laminate.

Figure 19:
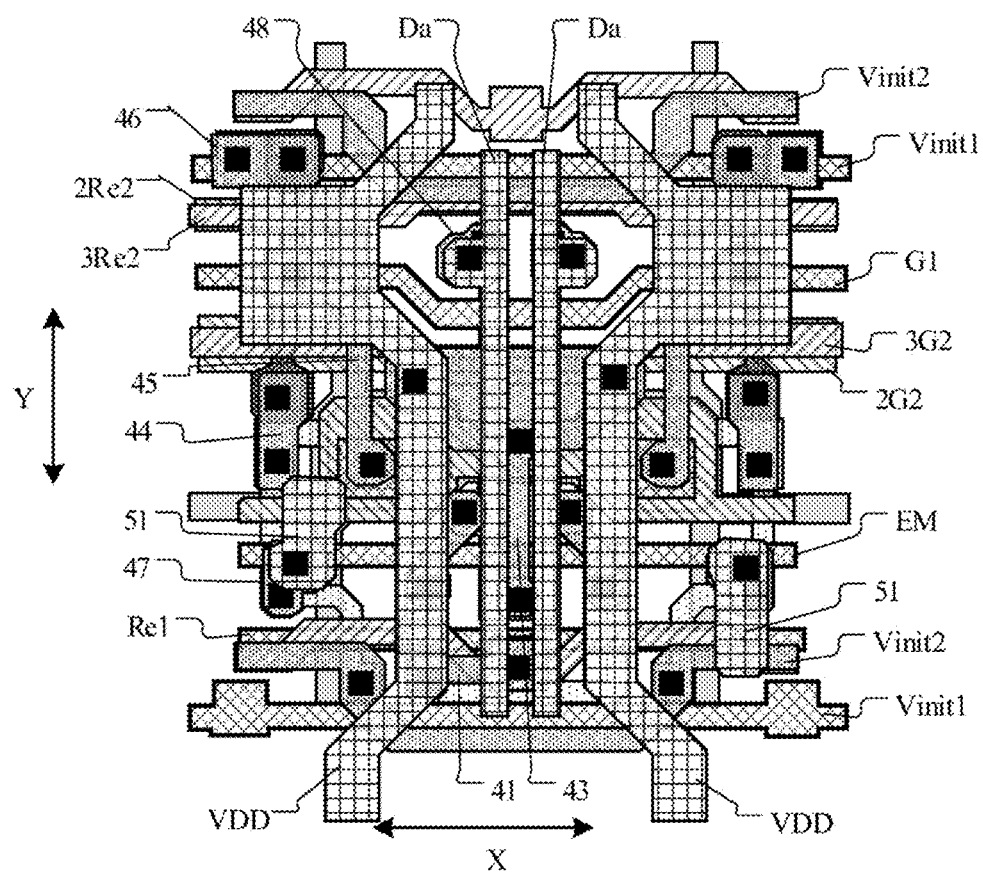
FIG. 19 is a structural layout of a display panel according to another exemplary embodiment of the present disclosure.
Figure 20:
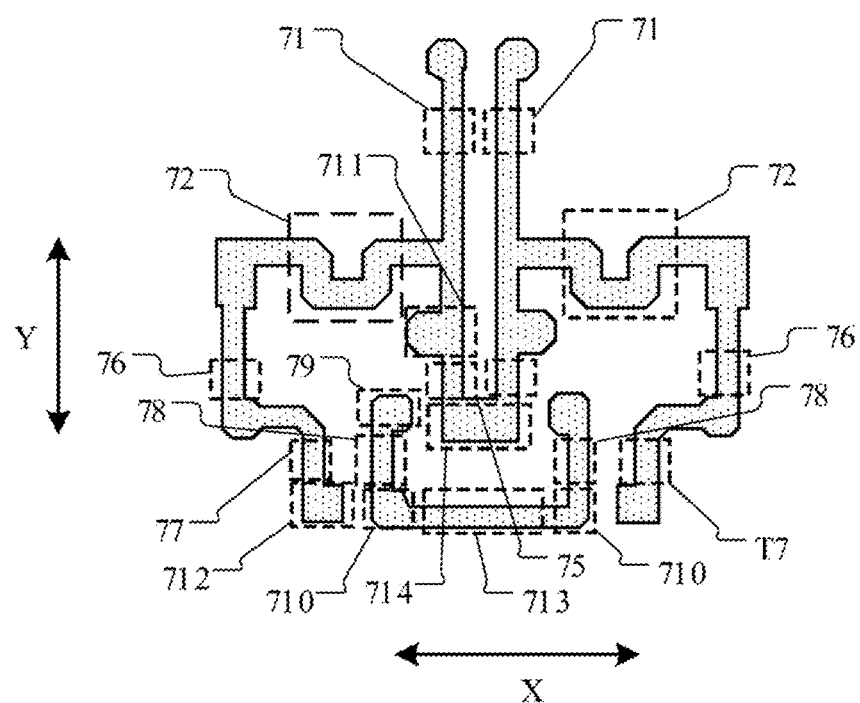
FIG. 20 is a structural layout of the first active layer in FIG. 19.

As shown in FIG. 19, FIG. 19 is a structural layout of a display panel according to another exemplary embodiment of the present disclosure. The display panel may include a plurality of pixel driving circuits shown in FIG. 1. The plurality of pixel driving circuits include the first pixel driving circuit P1 and the second pixel driving circuit P2 that are adjacently arranged in the first direction X. At least part of the structures of the first pixel driving circuit P1 and the second pixel driving circuit P2 may be arranged in mirror symmetry. The display panel may also include a base substrate, a light-shielding layer, a first active layer, a first conductive layer, a second conductive layer, a second active layer, a third conductive layer, a fourth conductive layer, and a fifth conductive layer that are stacked in sequence.

The light-shielding layer in the display panel shown in FIG. 19 has the same layout structure as the light-shielding layer in the display panel shown in FIG. 3. The light-shielding layer may include a plurality of light-shielding portions 61 arranged in the first direction X, and a connection part 62 connected between the light-shielding portions 61.

The first conductive layer in the display panel shown in FIG. 19 has the same layout structure as the first conductive layer in the display panel shown in FIG. 3. The first conductive layer may include a first initial signal line Vinit1, a first gate line G1, a first conductive portion 11, an enable signal line EM, and a first reset signal line Re1.

The second conductive layer in the display panel shown in FIG. 19 has the same layout structure as the second conductive layer in the display panel shown in FIG. 3. The second conductive layer may include a third gate line 2G2, a third reset signal line 2Re2, a second conductive portion 22, and a first connection part 21.

The second active layer in the display panel shown in FIG. 19 has the same layout structure as the second active layer in the display panel shown in FIG. 3. The second active layer may include an active portion 81, and the active portion 81 may include a third active portion 813 and a fourth active portion 814.

The third conductive layer in the display panel shown in FIG. 19 has the same layout structure as the third conductive layer in the display panel shown in FIG. 3. The third conductive layer may include a third initial signal line Vinit3, a second reset signal line 3Re2, and a second gate line 3G2.

The fifth conductive layer in the display panel shown in FIG. 19 has the same layout structure as the fifth conductive layer in the display panel shown in FIG. 3. The fifth conductive layer may include a power supply line VDD, a data line Da, and a bridge part 51.

Figure 21:
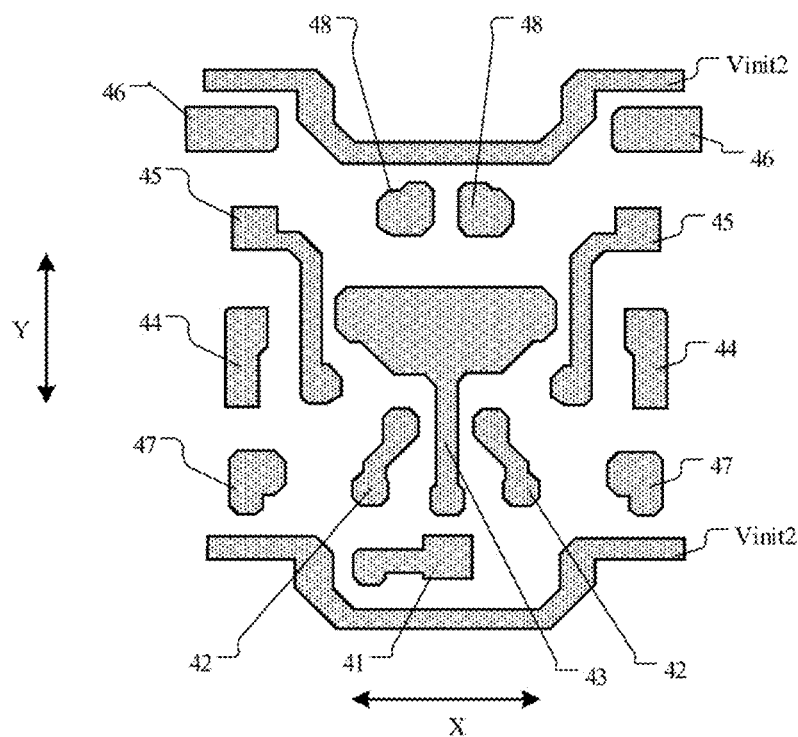
FIG. 21 is a structural layout of the fourth conductive layer in FIG. 19.
Figure 22:
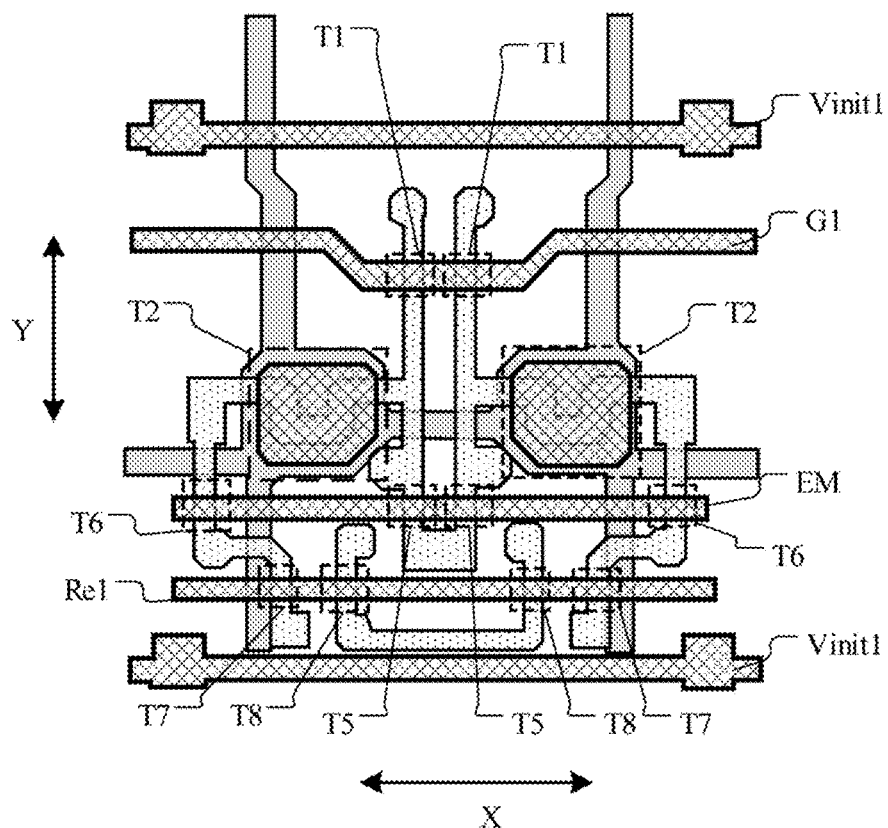
FIG. 22 is a structural layout of the light-shielding layer, the first active layer, and the first conductive layer in FIG. 19.
Figure 23:
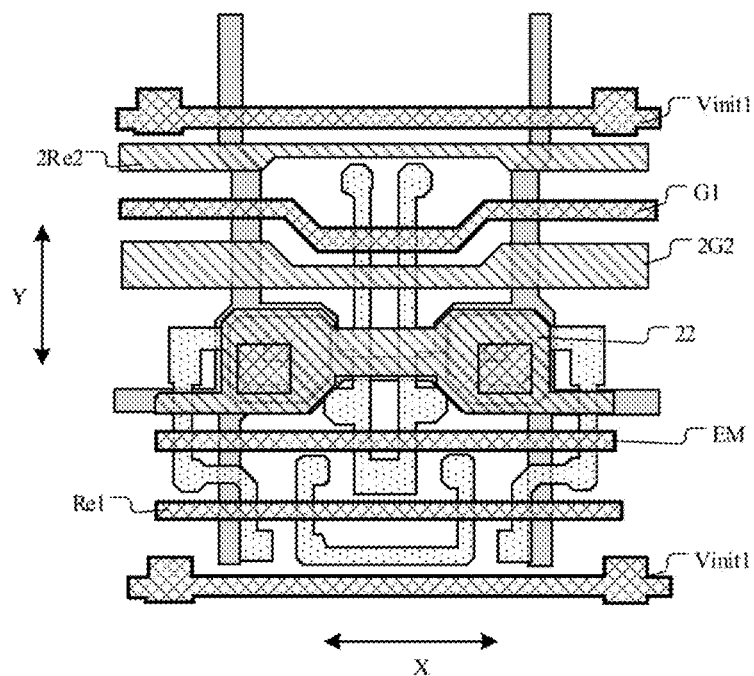
FIG. 23 is a structural layout of the light-shielding layer, the first active layer, the first conductive layer, and the second conductive layer in FIG. 19.
Figure 24:
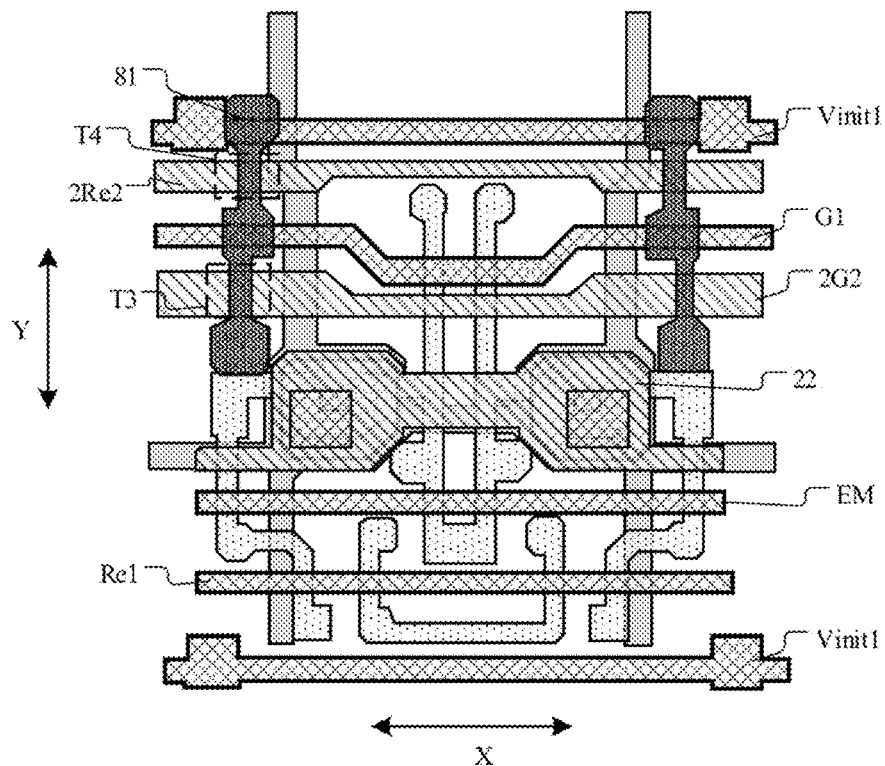
FIG. 24 is a structural layout of the light-shielding layer, the first active layer, the first conductive layer, the second conductive layer, and the second active layer in FIG. 19.
Figure 25:
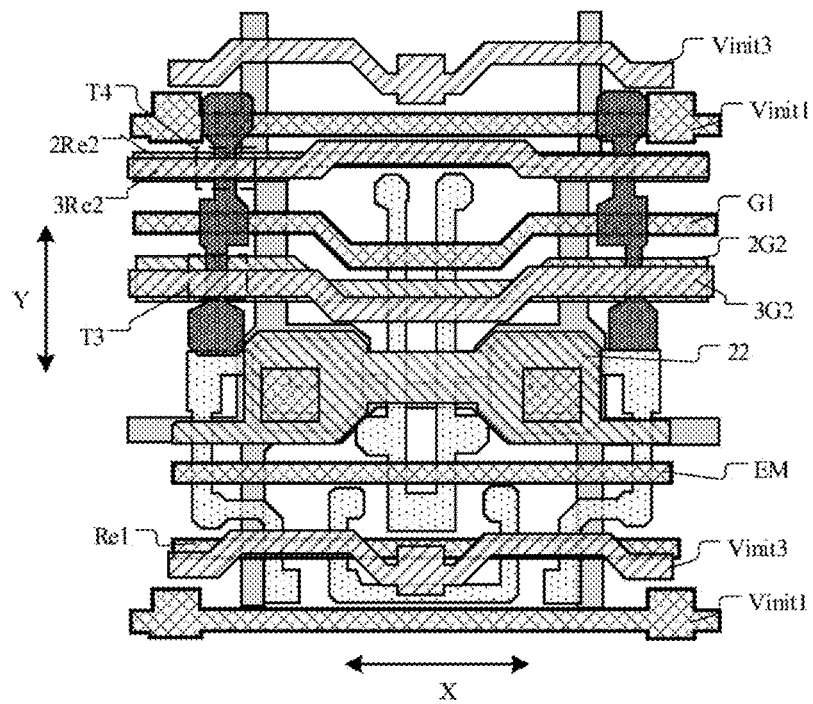
FIG. 25 is a structural layout of the light-shielding layer, the first active layer, the first conductive layer, the second conductive layer, the second active layer, and the third conductive layer in FIG. 19.
Figure 26:
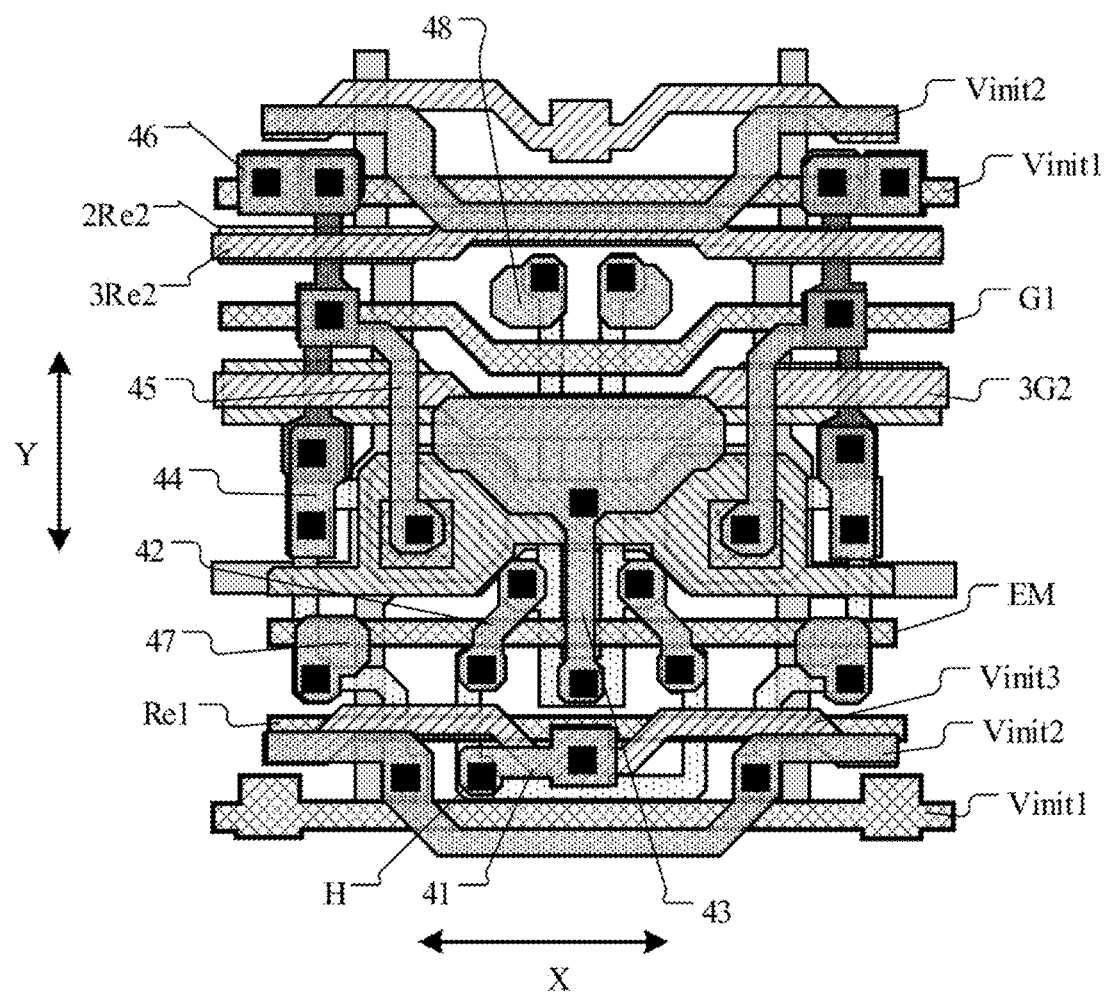
FIG. 26 is a structural layout of the light-shielding layer, the first active layer, the first conductive layer, the second conductive layer, the second active layer, the third conductive layer, and the fourth conductive layer in FIG. 19.

The display panel shown in FIG. 19 differs from the display panel shown in FIG. 3 only in that the structures of the first active layer and the fourth conductive layer are different. As shown in FIGS. 20-26, FIG. 20 is a structural layout of the first active layer in FIG. 19; FIG. 21 is a structural layout of the fourth conductive layer in FIG. 19; FIG. 22 is a structure layout of the light-shielding layer, the first active layer, and the first conductive layer in FIG. 19; FIG. 23 is a structure layout of the light-shielding layer, the first active layer, the first conductive layer and the second conductive layer in FIG. 19; FIG. 24 is a structure layout of the light-shielding layer, the first active layer, a first conductive layer, a second conductive layer, and a second active layer in FIG. 19; FIG. 25 is a structure layout of the light-shielding layer, the first active layer, the first conductive layer, the second conductive layer, the second active layer and the third conductive layer in FIG. 19; and FIG. 26 is a structure layout of the light-shielding layer, the first active layer, the first conductive layer, the second conductive layer, the second active layer, the third conductive layer, and the fourth conductive layer in FIG. 19.

As shown in FIGS. 19, 20, 22, 23, 24 and 25, the first active layer also includes a first active portion 71, a second active portion 72, a fifth active portion 75, a sixth active portion 76, a seventh active portion 77, an eighth active portion 78, a ninth active portion 79, a tenth active portion 710, an eleventh active portion 711, a twelfth active portion 712, a thirteenth active portion part 713, and a fourteenth active portion 714. The difference between the first active layer shown in FIG. 20 and the first active layer shown in FIG. 4 is that, in the first active layer shown in FIG. 20, the tenth active portion 710 in the second pixel driving circuit P2 is not arranged in mirror symmetry with the tenth active layer 710 in the second pixel driving circuit P2, and the orthographic projection area on the substrate of the tenth active portion 710 in the second pixel driving circuit P2 is slightly smaller than that the orthographic projection area on the base substrate of the tenth active portion 710 in the first pixel driving circuit P1.

As shown in FIGS. 19, 21 and 25, the fourth conductive portion may also include a second initial signal line Vinit2, a first bridge part 41, a second bridge part 42, a third bridge part 43, a fourth bridge part 44, a fifth bridge part 45, a sixth bridge part 46, a seventh bridge part 47, and an eighth bridge part 48. The first bridge part 41 in the first pixel driving circuit P1 may be reused as the first bridge part in the second pixel driving circuit P2. That is, the first bridge part 41 is not provided in the second pixel driving circuit, and the tenth active portion 710 in the second pixel driving circuit is connected to the third initial signal line Vinit3 through the first bridge part 41 in the first pixel driving circuit.

In the display panel shown in FIG. 19, a large space may be left at the position of the tenth active portion 710 in the second pixel driving circuit, so as to facilitate the layout arrangement of other structures. As shown in FIGS. 22-24, other structures of the display panel shown in FIG. 19 are the same as those of the display panel shown in FIG. 3. As shown in FIG. 19, the cross-sectional view taken along the dotted line AA in FIG. 19 is the same as that in FIG. 18.

Figure 27:
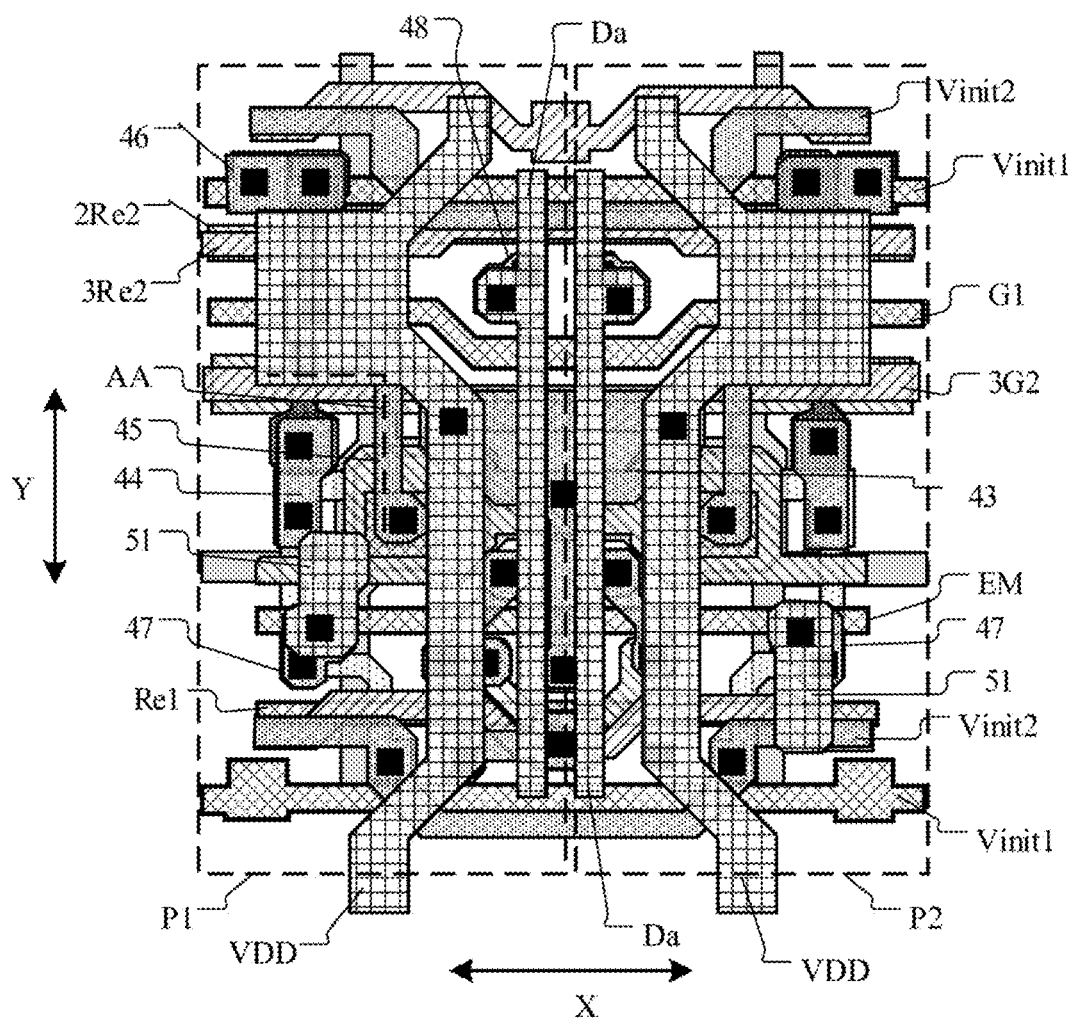
FIG. 27 is a structural layout of a display panel according to another exemplary embodiment of the present disclosure.

As shown in FIG. 27, it is a structural layout of the display panel according to another exemplary embodiment of the present disclosure. The display panel may include a plurality of pixel driving circuits shown in FIG. 1. The plurality of pixel driving circuits include a first pixel driving circuit P1 and a second pixel driving circuit P2 adjacently arranged in the first direction X. At least part of the structures of the first pixel driving circuit P1 and the second pixel driving circuit P2 may be arranged in mirror symmetry. The display panel may also include a base substrate, a light-shielding layer, a first active layer, a first conductive layer, a second conductive layer, a second active layer, a third conductive layer, a fourth conductive layer, and a fifth conductive layer stacked in sequence. In an exemplary embodiment, the eighth transistor in the first pixel driving circuit may be reused as the eighth transistor in the second pixel driving circuit.

The light-shielding layer in the display panel shown in FIG. 27 has the same layout structure as the light-shielding layer in the display panel shown in FIG. 3. The light-shielding layer may include a plurality of light-shielding portions 61 arranged in the first direction X, and a connection part 62 connected between the light-shielding portions 61.

The first conductive layer in the display panel shown in FIG. 27 has the same layout structure as the first conductive layer in the display panel shown in FIG. 3. The first conductive layer may include a first initial signal line Vinit1, a first gate line G1, a first conductive portion 11, an enable signal line EM, and a first reset signal line Re1.

The second active layer in the display panel shown in FIG. 27 has the same layout structure as the second active layer in the display panel shown in FIG. 3. The second active layer may include an active portion 81, and the active portion 81 may include a third active portion 813 and a fourth active portion 814.

The third conductive layer in the display panel shown in FIG. 27 has the same layout structure as the third conductive layer in the display panel shown in FIG. 3. The third conductive layer may include a third initial signal line Vinit3, a second reset signal line 3Re2, and a second gate line 3G2.

The fifth conductive layer in the display panel shown in FIG. 27 has the same layout structure as the fifth conductive layer in the display panel shown in FIG. 3. The fifth conductive layer may include a power supply line VDD, a data line Da, and a bridge part 51.

Figure 29:
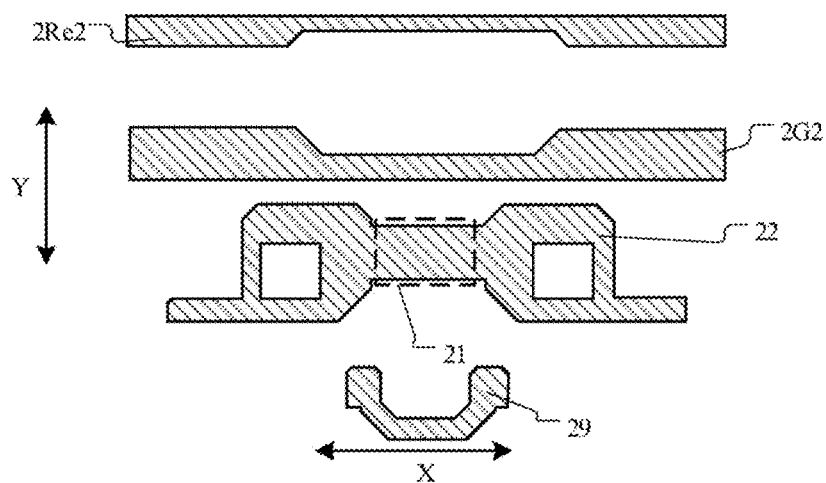
FIG. 29 is a structural layout of the second conductive layer in FIG. 27.
Figure 30:
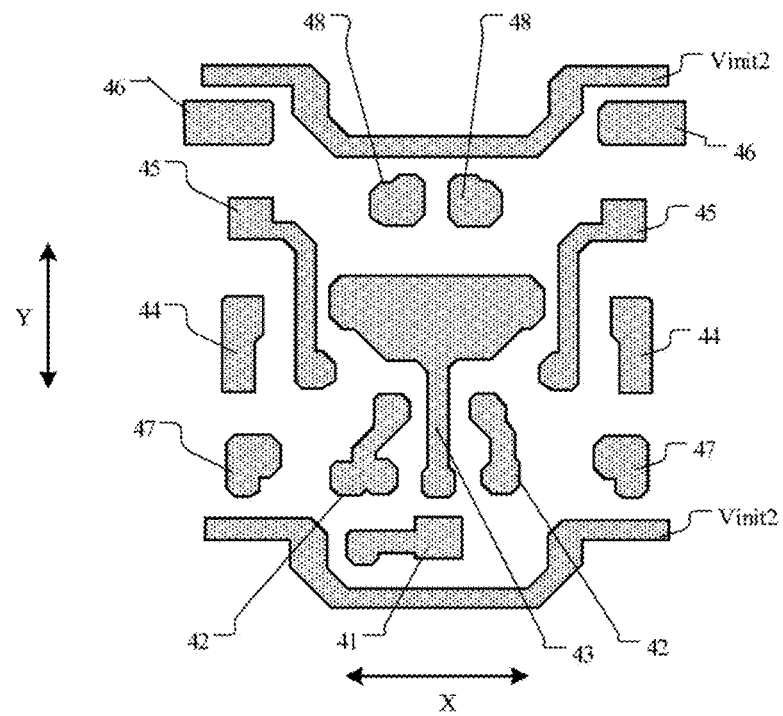
FIG. 30 is a structural layout of the fourth conductive layer in FIG. 27.
Figure 31:
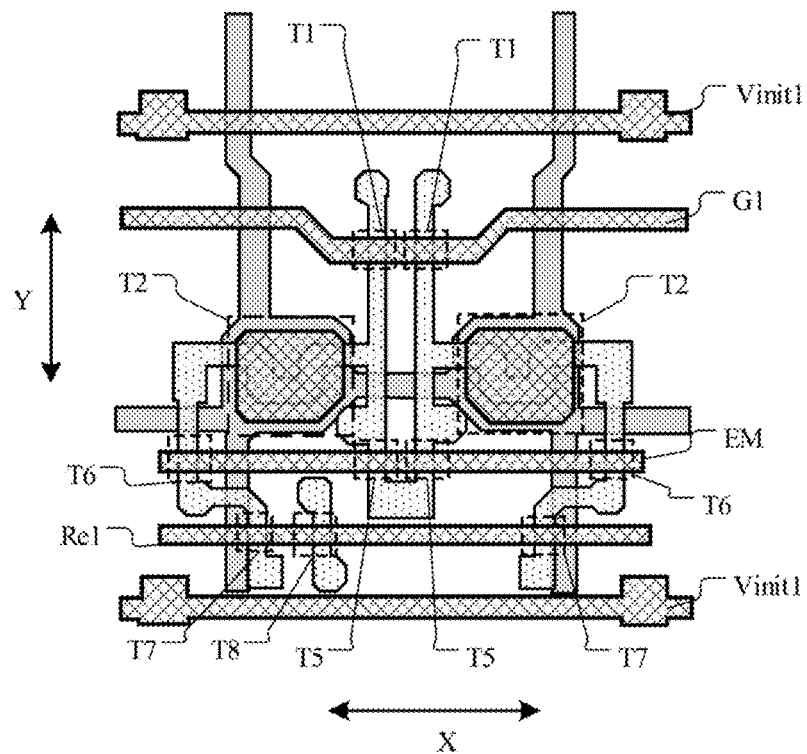
FIG. 31 is a structural layout of the light-shielding layer, the first active layer, and the first conductive layer in FIG. 27.
Figure 32:
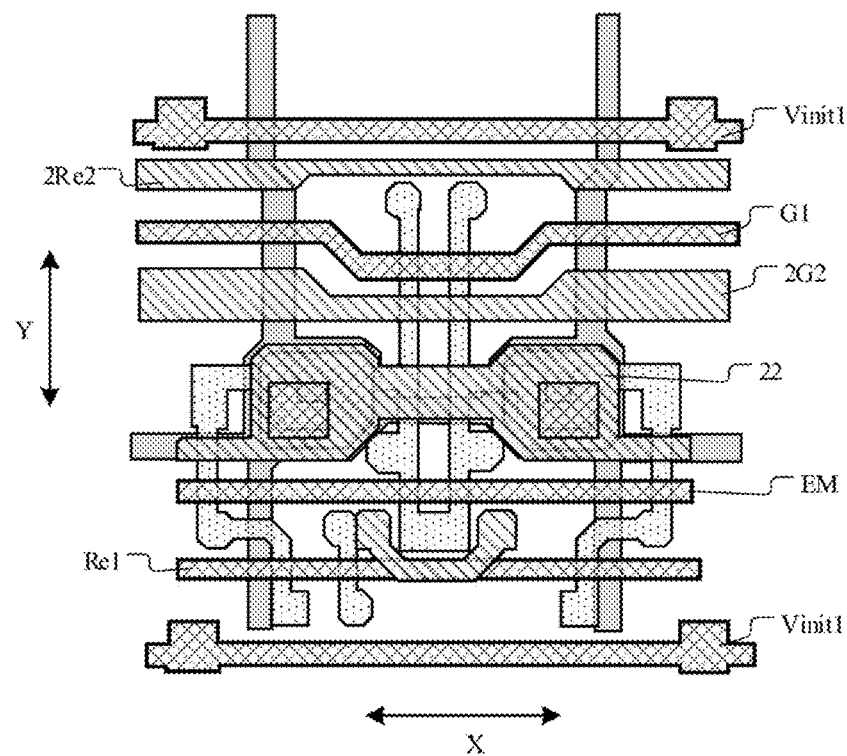
FIG. 32 is a structural layout of the light-shielding layer, the first active layer, the first conductive layer, and the second conductive layer in FIG. 27.
Figure 33:
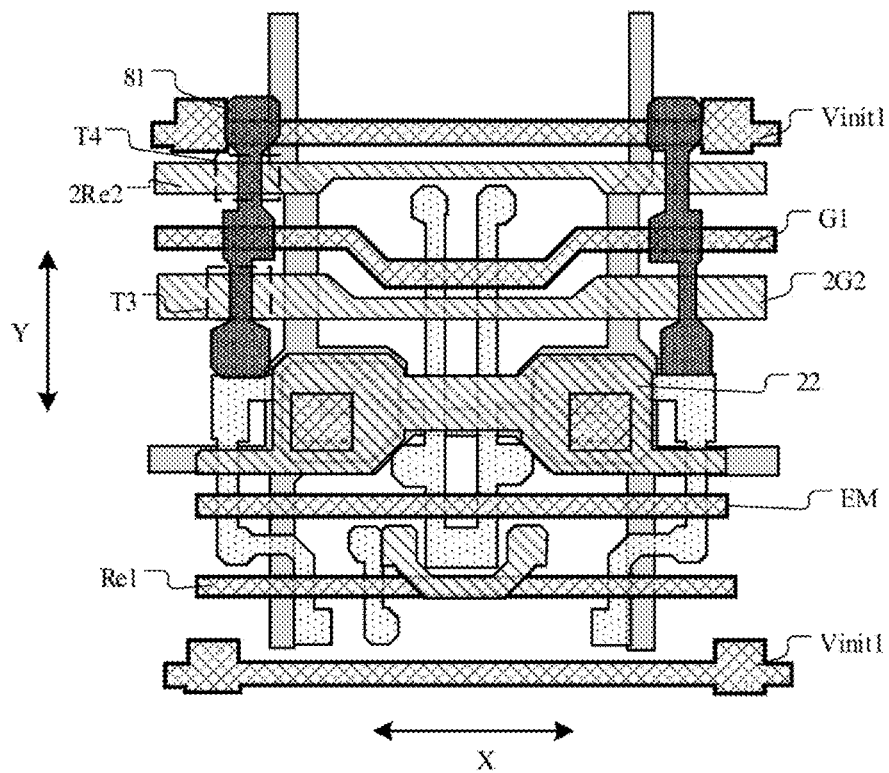
FIG. 33 is a structural layout of the light-shielding layer, the first active layer, the first conductive layer, the second conductive layer, and the second active layer in FIG. 27.
Figure 34:
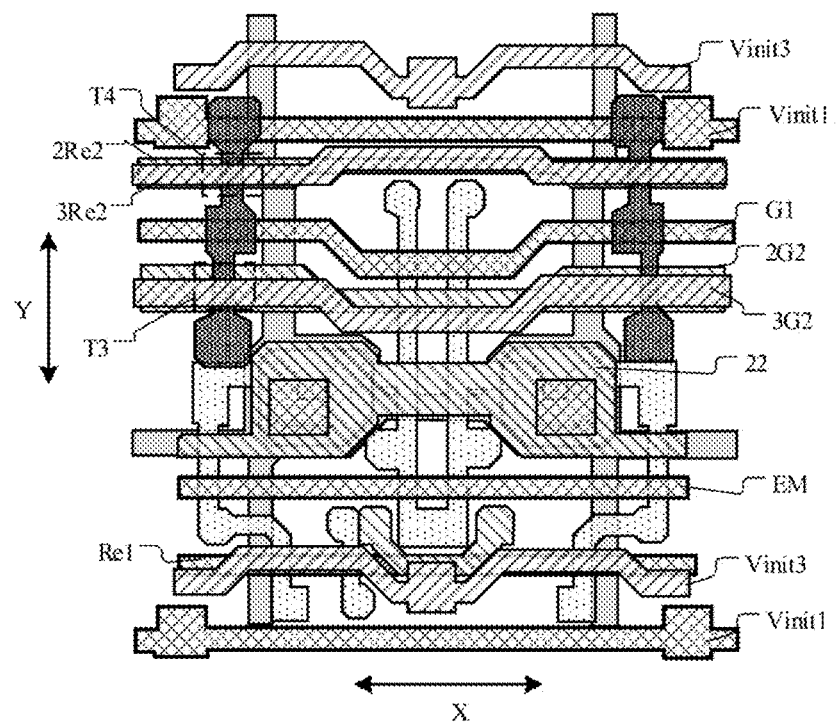
FIG. 34 is a structural layout of the light-shielding layer, the first active layer, the first conductive layer, the second conductive layer, the second active layer, and the third conductive layer in FIG. 27.
Figure 35:
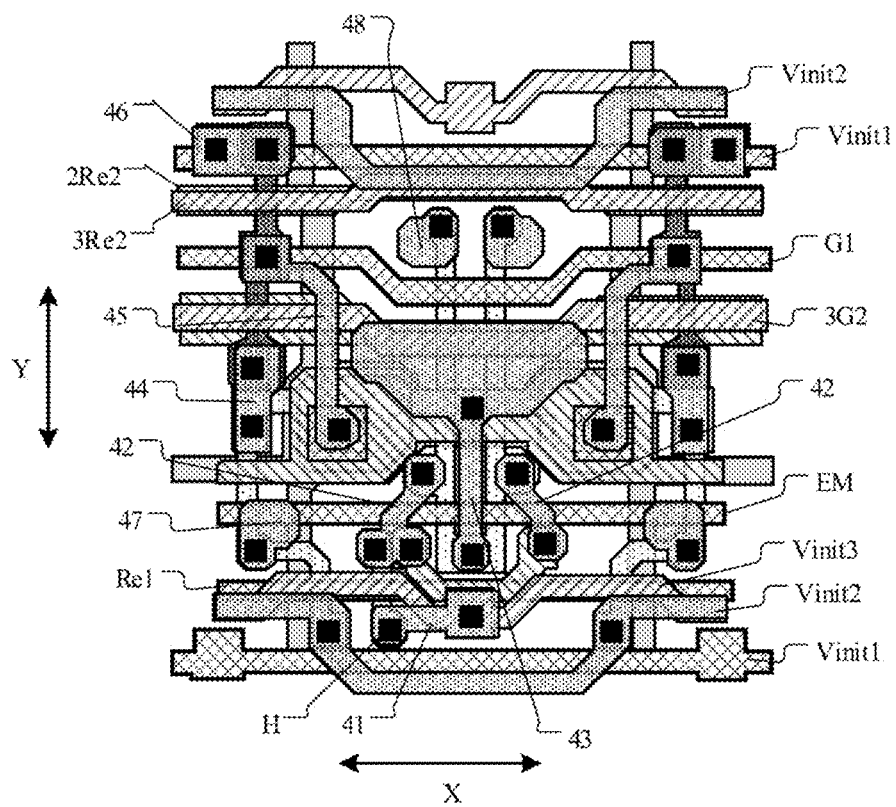
FIG. 35 is a structural layout of the light-shielding layer, the first active layer, the first conductive layer, the second conductive layer, the second active layer, the third conductive layer, and the fourth conductive layer in FIG. 27.

The display panel shown in FIG. 27 differs from the display panel shown in FIG. 3 only in that, the structures of the first active layer, the second conductive layer and the fourth conductive layer are different. As shown in FIGS. 28-35, FIG. 28 is the structural layout of the first active layer in FIG. 27; FIG. 29 is the structural layout of the second conductive layer in FIG. 27; FIG. 30 is the structural layout of the fourth conductive layer in FIG. 27; FIG. 31 is the structure layout of the light-shielding layer, the first active layer and the first conductive layer in FIG. 27; FIG. 32 is the structure layout of the light-shielding layer, the first active layer, the first conductive layer and the second conductive layer in FIG. 27; FIG. 33 is the structure layout of the light-shielding layer, the first active layer, the first conductive layer, the second conductive layer and the second active layer in FIG. 27; FIG. 34 is the structure layout of the light-shielding layer, the first active layer, the first conductive layer, the second conductive layer, the second active layer, and the third conductive layer; and FIG. 35 is the structure layout of the light-shielding layer, the first active layer, the first conductive layer, the second conductive layer, the second active layer, the third conductive layer, and the fourth conductive layer in FIG. 27.

Figure 28:
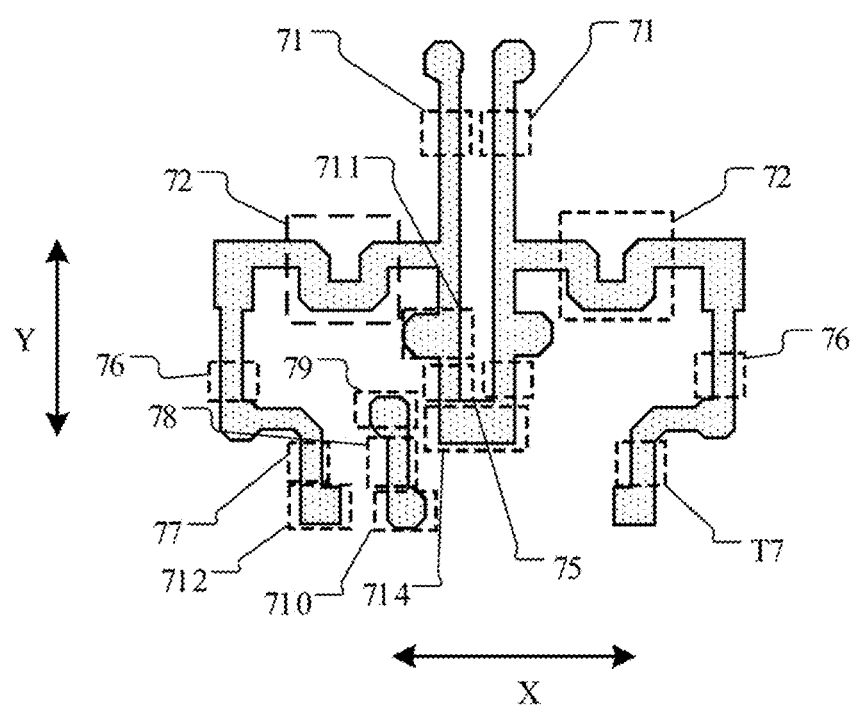
FIG. 28 is a structural layout of the first active layer in FIG. 27.

As shown in FIGS. 27 and 28, the first active layer also includes a first active portion 71, a second active portion 72, a fifth active portion 75, a sixth active portion 76, a seventh active portion 77, an eighth active portion 78, a ninth active portion 79, a tenth active portion 710, an eleventh active portion 711, a twelfth active portion 712, and a fourteenth active portion 714. The difference between the first active layer shown in FIG. 28 and the first active layer shown in FIG. 4 is that, in the first active layer shown in FIG. 28, the eighth active portion 78 in the first pixel driving circuit P1 is reused as the eighth active portion 78 in the second pixel driving circuit P2, the ninth active portion 79 in the first pixel driving circuit P1 is reused as the ninth active portion 79 in the second pixel driving circuit P2, the tenth active portion 710 in the first pixel driving circuit P1 is reused as the tenth active portion 710 in the second pixel driving circuit P2, and the thirteenth active portion 713 is not provided in the first active layer shown in FIG. 28. That is, the eighth active portion 78, the ninth active portion 79, and the tenth active portion 710 are not provided in the second pixel driving circuit P2.

As shown in FIGS. 27, 29, 32-35, the second conductive layer in the display panel shown in FIG. 27 may also include a third gate line 2G2, a third reset signal line 2Re2, a second conductive portion 22, and a first connection part 21. In addition, the second conductive layer may further include a ninth bridge part 29. The ninth bridge part 29 may be mirror-symmetrical in the mirror symmetry plane of the first pixel driving circuit P1 and the second pixel driving circuit P2. In addition, the ninth bridge part 29 may also be located on other conductive layers, for example, the first conductive layer, the third conductive layer, and other additional conductive layers.

As shown in FIGS. 27, 30 and 35, the fourth conductive portion may also include a second initial signal line Vinit2, a first bridge part 41, a second bridge part 42, a third bridge part 43, a fourth bridge part 44, a fifth bridge part 45, a sixth bridge part 46, a seventh bridge part 47, and an eighth bridge part 48. The first bridge part 41 in the first pixel driving circuit P1 may be reused as the first bridge part in the second pixel driving circuit P2. That is, the first bridge part 41 is not provided in the second pixel driving circuit. In addition, the second bridge part 42 in the first pixel driving circuit P1 includes three via connection portions. The second bridge part 42 in the first pixel driving circuit P1 is connected to the ninth active portion 79, the eleventh active portion 711, and the ninth bridge part 29 in the first pixel driving circuit P1 through the three via connection portions respectively. The second bridge part 42 in the second pixel driving circuit P2 includes two via connection portions. The second bridge part 42 in the second pixel driving circuit P2 is connected to the eleventh active portion 711 and the ninth bridge part 29 in the second pixel driving circuit P2 through the two via connection portions respectively.

In the display panel shown in FIG. 27, a large space may be left at the position of the original eighth transistor in the second pixel driving circuit, so that the layout of other structures may be set. As shown in FIGS. 31-35, other structures of the display panel shown in FIG. 27 are the same as those of the display panel shown in FIG. 3. As shown in FIG. 27, the sectional view taken along the dotted line AA in FIG. 27 is the same as that in FIG. 18.

Figure 36:
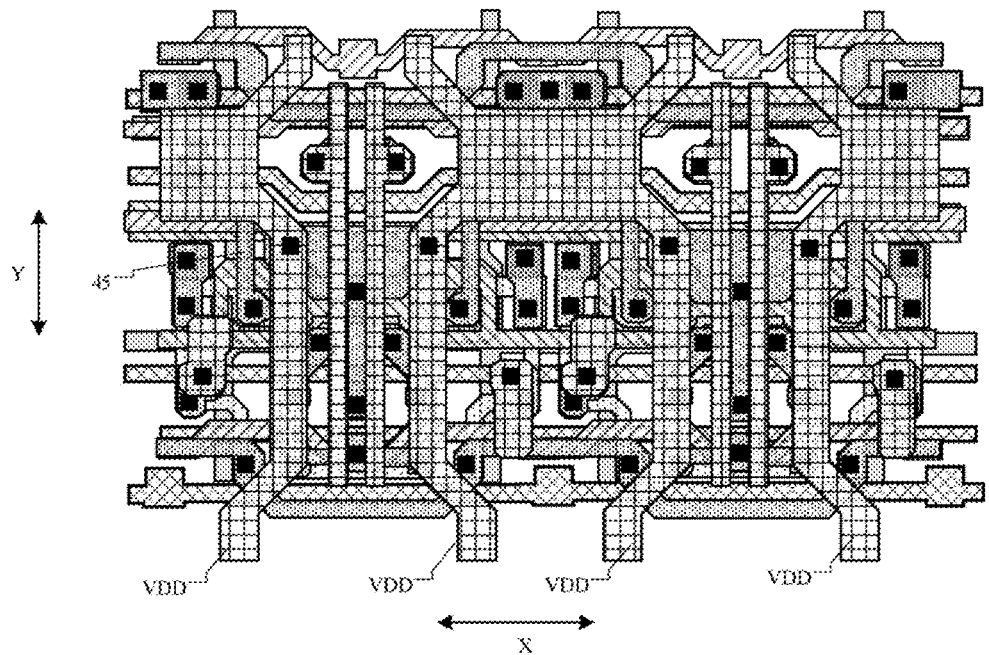
FIG. 36 is a structural layout of a display panel according to another exemplary embodiment of the present disclosure.

As shown in FIG. 36, it is a structural layout of the display panel according to another exemplary embodiment of the present disclosure. The structure shown in FIG. 36 includes two adjacent repeating units shown in FIG. 3 in the first direction X. In the two repeating units, adjacent power supply lines VDD are connected. The orthographic projection of the power supply line VDD on the base substrate may at least partially overlap with the orthographic projection on the base substrate of the second active layer connected between the third active portion 813 and the fourth active portion 814. The overlapping area between the orthographic projection on the base substrate of the power supply line VDD and the orthographic projection on the base substrate of the second active layer connected between the third active portion 813 and the fourth active portion 814 is S1. The area of the orthographic projection on the base substrate of the second active layer connected between the third active portion 813 and the fourth active portion 814 is S2. S1/S2 may be greater than or equal to 90%. For example, S1/S2 may be 90%, 95%, 100%, etc. This arrangement helps to stabilize the second active layer connected between the third active portion 813 and the fourth active portion 814 through the power supply line VDD, thereby reducing the voltage fluctuation of the gate of the driving transistor during the light-emitting stage.

Figure 37:
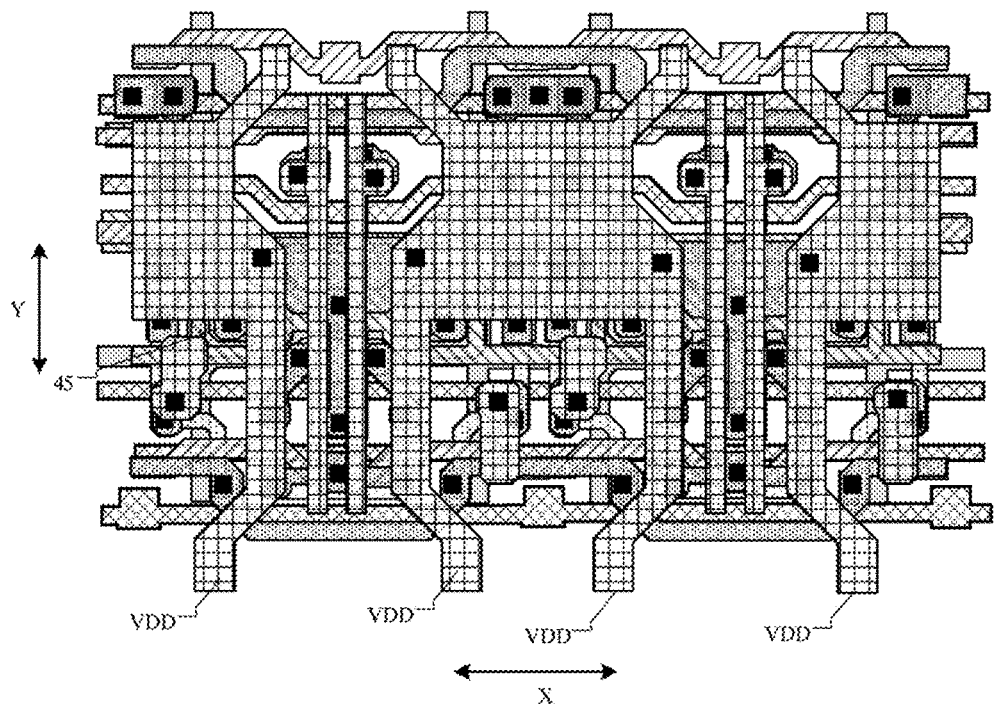
FIG. 37 is a structural layout of a display panel according to another exemplary embodiment of the present disclosure.
Figure 38:
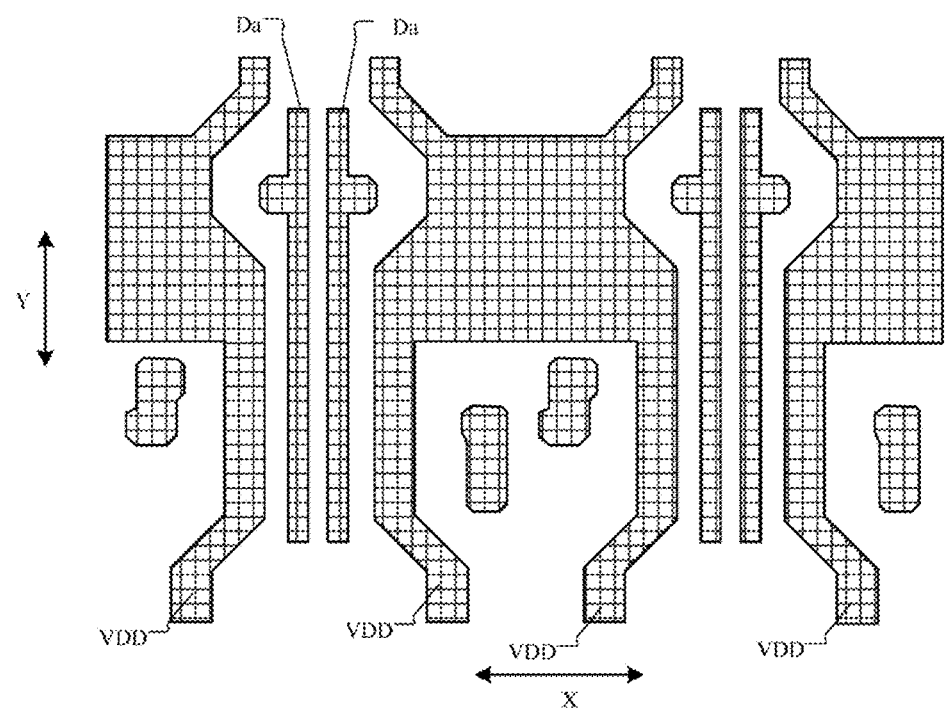
FIG. 38 is a structural layout of the fifth conductive layer in the display panel shown in FIG. 37.

FIG. 37 is a structural layout of the display panel according to another exemplary embodiment of the present disclosure, and FIG. 38 is a structural layout of the fifth conductive layer in the display panel shown in FIG. 37. The display panel shown in FIG. 37 differs from the display panel shown in FIG. 36 only in that, the structure of the power supply line VDD in the fifth conductive layer is different. As shown in FIG. 37, the orthographic projection of the power supply line VDD on the base substrate at least partially overlaps with the orthographic projection of the fifth bridge part 45 on the base substrate. The overlapping area between the orthographic projection of the power supply line VDD on the base substrate and the orthographic projection of the fifth bridge part 45 on the base substrate is S3. The area of the orthographic projection of the fifth bridge part 45 on the base substrate is S4. S3/S4 may be greater than or equal to 80%, for example, 80%, 90%, 95%, etc. This setting helps to stabilize the voltage of the fifth bridge part 45 through the power supply line VDD, thereby reducing the voltage fluctuation of the gate of the driving transistor during the light-emitting stage.

Figure 39:
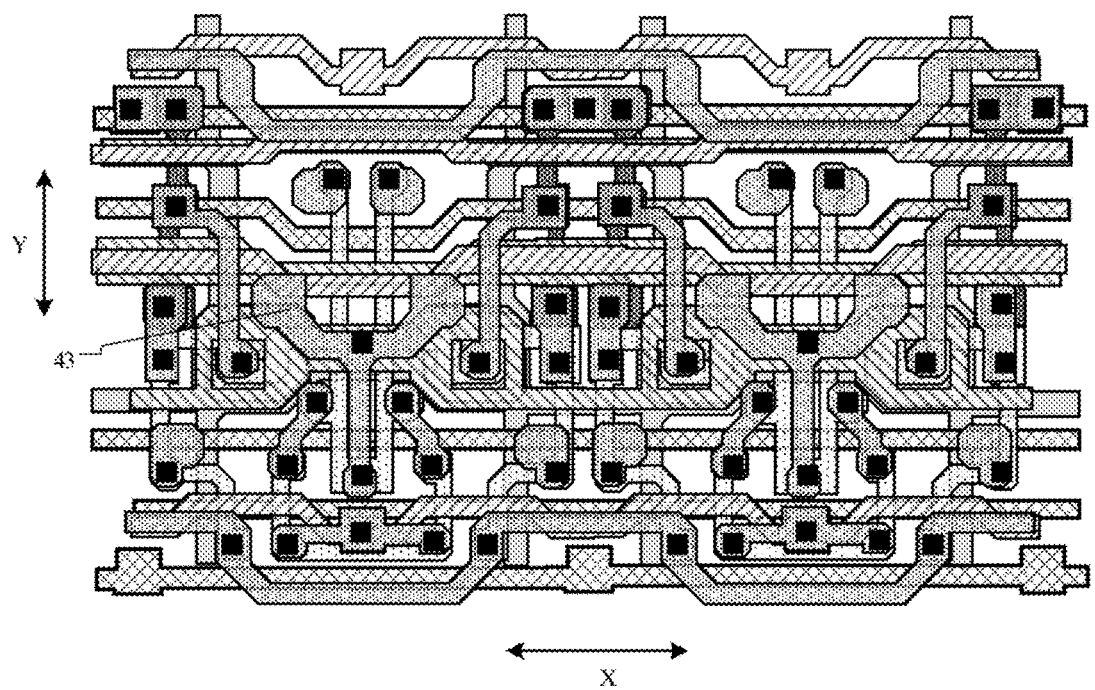
FIG. 39 is a structural layout of a light-shielding layer, a first active layer, a first conductive layer, a second conductive layer, a second active layer, a third conductive layer, and a fourth conductive layer the display panel according to another exemplary embodiment of the present disclosure.
Figure 40:
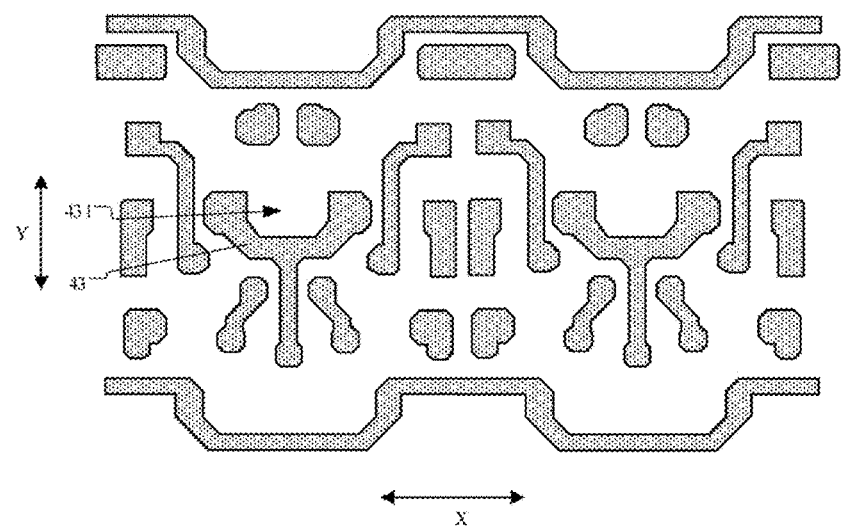
FIG. 40 is a structural layout of the fourth conductive layer in the display panel shown in FIG. 39.

As shown in FIGS. 39 and 40, FIG. 39 is a structural layout of a light-shielding layer, a first active layer, a first conductive layer, a second conductive layer, a second active layer, a third conductive layer and a fourth conductive layer in the display panel according to another exemplary embodiment of the present disclosure; and FIG. 40 is a structural layout of the fourth conductive layer in the display panel shown in FIG. 39. The only difference between the hierarchical structures in the display panel shown in FIG. 39 and the corresponding hierarchical structures in the display panel shown in FIG. 36 is in that, the third bridge part 43 in the fourth conductive layer of the display panel shown in FIG. 39 has a different structure. As shown in FIGS. 39 and 40, the third bridge part 43 may have a hollow portion 431, and the hollow portion 431 may be located in the light-transmitting area of the display panel. The the light-transmitting area of the display panel may be understood as the area not covered by the light-shielding layer, the first active layer, the first conductive layer, the second conductive layer, the second active layer, the third conductive layer, the fourth conductive layer, and the fifth conductive layer. This setting helps to improve the transmittance of the display panel.

Figure 41:
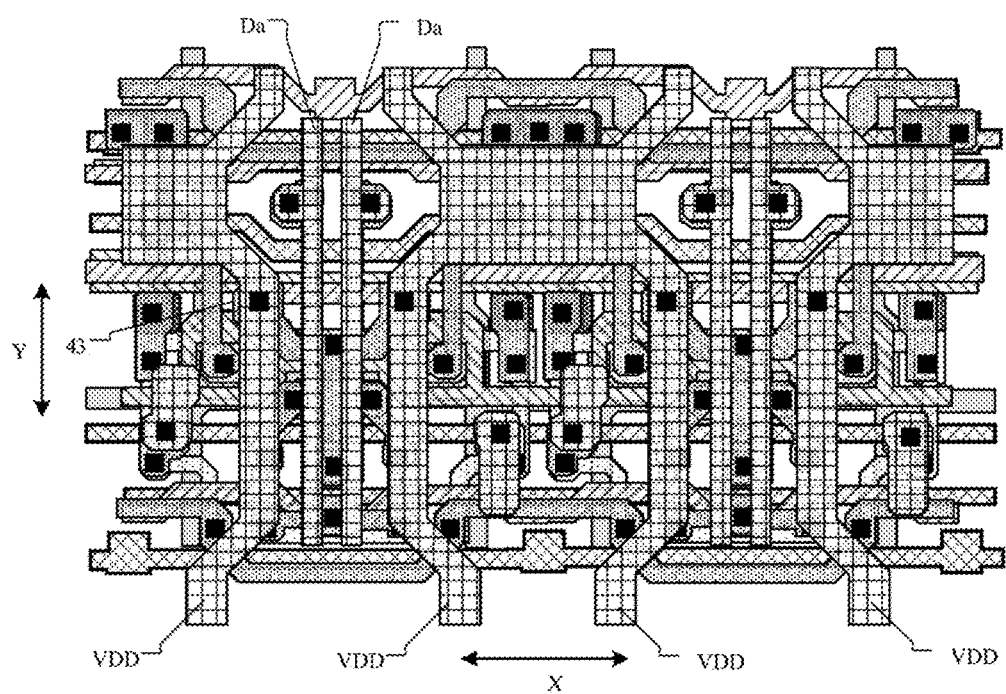
FIG. 41 is a structural layout of a display panel according to another exemplary embodiment of the present disclosure

As shown in FIG. 41, which is a structural layout of a display panel according to another exemplary embodiment of the present disclosure. The display panel may include the structure of the display panel shown in FIG. 39. In addition, the display panel further includes a fifth conductive layer located on a side of the fourth conductive layer away from the base substrate. The fifth conductive layer may include the power supply line VDD and the data line Da. The orthographic projection on the base substrate of the hollow portion 431 on the third bridge part 43 may intersect with the orthographic projection on the base substrate of the data line Da. Arranging the hollow portion 431 on the third bridge part 43 may also reduce the coupling effect of the third bridge part 43 on the data line Da.

Figure 42:
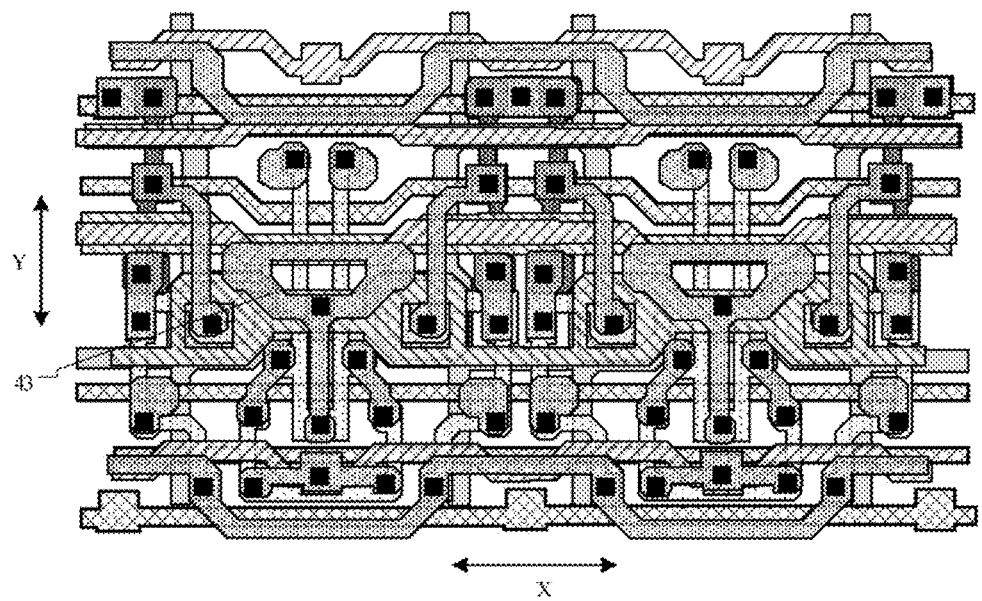
FIG. 42 is a structural layout of the light-shielding layer, the first active layer, the first conductive layer, the second conductive layer, the second active layer, the third conductive layer, and the fourth conductive layer in the display panel according to another exemplary embodiment of the present disclosure.
Figure 43:
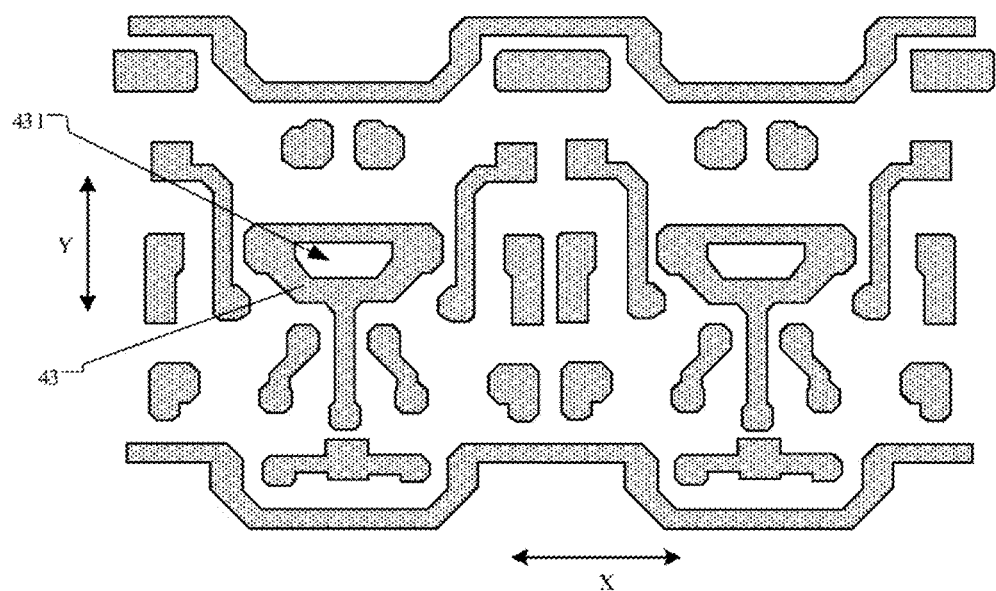
FIG. 43 is a structural layout of the fourth conductive layer in the display panel shown in FIG. 42.

As shown in FIGS. 39 and 40, the hollow portion 431 is a non-closed pattern. It should be understood that the hollow portion may also be a closed pattern. For example, as shown in FIGS. 42 and 43, FIG. 42 is a structure layout of the light-shielding layer, the first active layer, the first conductive layer, the second conductive layer, the second active layer, the third conductive layer, and the fourth conductive layer in the display panel according to another exemplary embodiment of the present disclosure; and FIG. 43 is the structural layout of the fourth conductive layer in the display panel shown in FIG. 42. The structure of the display panel shown in FIG. 42 is different from the structure of the display panel shown in FIG. 39 only in that, the shape of the hollow portion 431 is different. The hollow portion 431 in the closed pattern may also improve the transmittance of the display panel and reduce the coupling effect of the third bridge part 43 on the data line Da.

Figure 44:
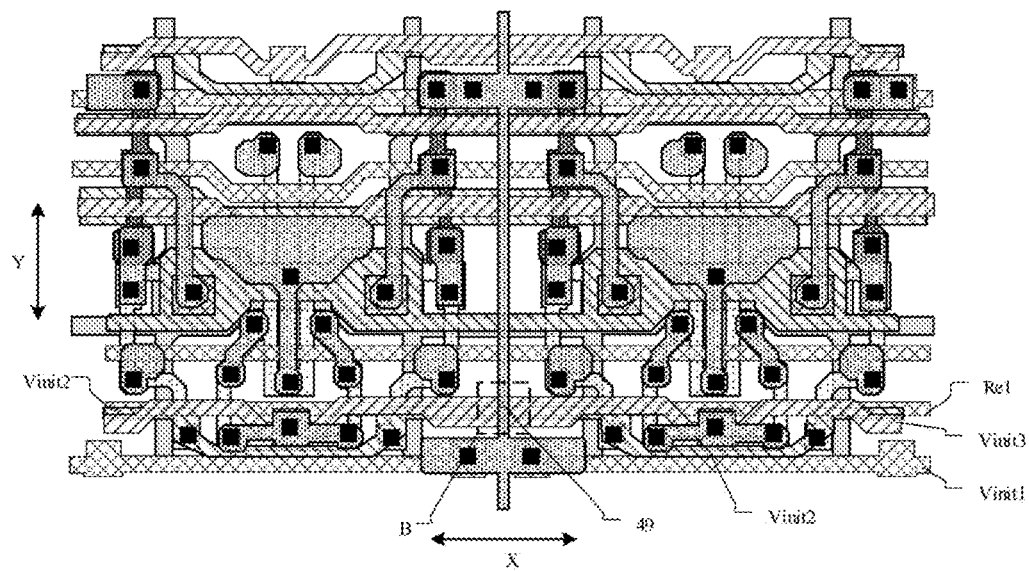
FIG. 44 is a structural layout of a light-shielding layer, a first active layer, a first conductive layer, a second conductive layer, a second active layer, a third conductive layer, and a fourth conductive layer in the display panel according to another exemplary embodiment of the present disclosure.
Figure 45:
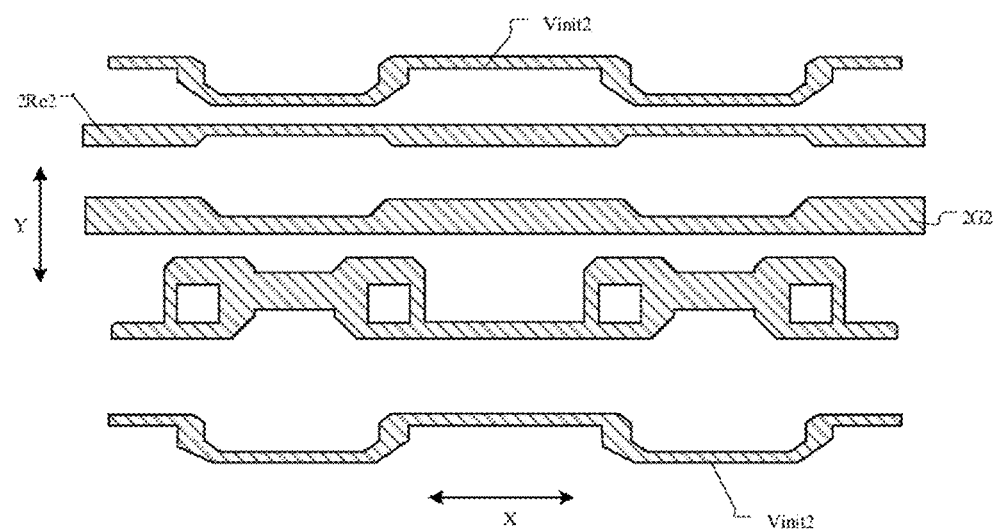
FIG. 45 is a structural layout of the second conductive layer in FIG. 44.
Figure 46:
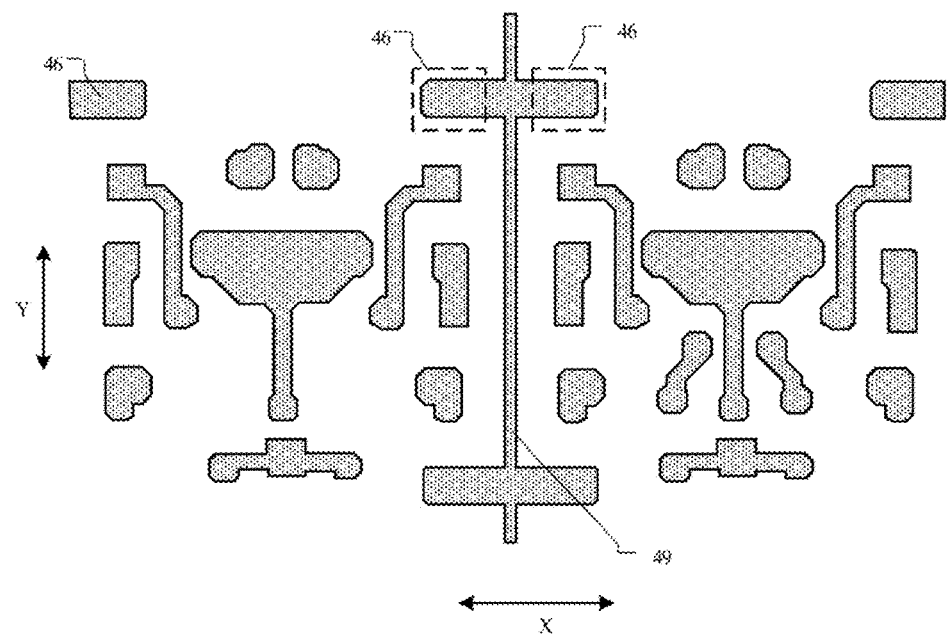
FIG. 46 is a structural layout of the fourth conductive layer in FIG. 44.

As shown in FIGS. 44, 45 and 46, FIG. 44 is a structural layout of a light-shielding layer, a first active layer, a first conductive layer, a second conductive layer, a second active layer, a third conductive layer and a fourth conductive layer in the display panel according to another exemplary embodiment of the present disclosure; FIG. 45 is the structural layout of the second conductive layer in FIG. 44; and FIG. 46 is the structural layout of the fourth conductive layer in FIG. 44. The difference between the hierarchical structures in the display panel shown in FIG. 44 and the corresponding hierarchical structures in the display panel shown in FIG. 36 is that, the second conductive layer and the fourth conductive layer have different partial structures. As shown in FIG. 45, the second initial signal line Vinit2 may be disposed on the second conductive layer, and the distance between the second conductive layer and the first active layer is relatively close, so that yield of the via hole between the second initial signal line Vinit2 and the twelfth active portion may be improved. As shown in FIG. 46, the fourth conductive layer may further include a connection line 49. The orthographic projection of the connection line 49 on the base substrate extends along the second direction Y. The connection line 49 is connected between two sixth bridge parts 46 in the adjacent repeating units along the first direction X, and is further connected between two sixth bridge parts 46 in the adjacent pixel driving circuits along the second direction Y. The connection line 49 may connect the first initial signal line Vinit1 as a grid structure, thereby reducing the voltage drop of the first initial signal line Vinit1 and improving the reset effect of the gate of the driving transistor.

As shown in FIG. 44, in the area where the dotted box B is located, the first reset signal line Re1, the second initial signal line Vinit2, and the third initial signal line Vinit3 extending along the first direction X are stacked in sequence, so that the insulation layer located between the third conductive line and the fourth conductive layer has a protrusion facing the fourth conductive layer at the position of the dotted box B, and the protrusion may cause the connection line 49 to be broken at the position of the dotted box B. In an exemplary embodiment, at the position of the dotted box B, among the three side edges on the same side of the first reset signal line Re1, the second initial signal line Vinit2, and the third initial signal line Vinit3 in the second direction Y, the orthographic projections on the base substrate of at least two side edges may not overlap. This arrangement helps to make the above-mentioned protrusion forming a stepped structure, so as to reduce the risk of breakage of the connection line 49. For example, at the position of the dotted box B, the size in the second direction Y of the orthographic projection on the base substrate of the first reset signal line Re1, the size in the second direction Y of the orthographic projection on the base substrate of the second initial signal line Vinit2, and the size in the second direction Y of the orthographic projection on the base substrate of the third initial signal line Vinit3 increase sequentially. The orthographic projection of the third initial signal line Vinit3 on the base substrate may cover the orthographic projection of the first reset signal line Re1 on the base substrate and the orthographic projection of the second initial signal line Vinit2 on the base substrate. For another example, at the position of the dotted box B, the size in the second direction Y of the orthographic projection on the base substrate of the first reset signal line Re1, the size in the second direction Y of the orthographic projection on the base substrate of the second initial signal line Vinit2, and the size in the second direction Y of the orthographic projection on the base substrate of the third initial signal line Vinit3 may be approximately the same. The orthographic projection of the first reset signal line Re1 on the base substrate, the orthographic projection of the second initial signal line Vinit2 on the base substrate, and the orthographic projection of the third initial signal line Vinit3 on the substrate are displaced from each other in the second direction Y.

Figure 47:
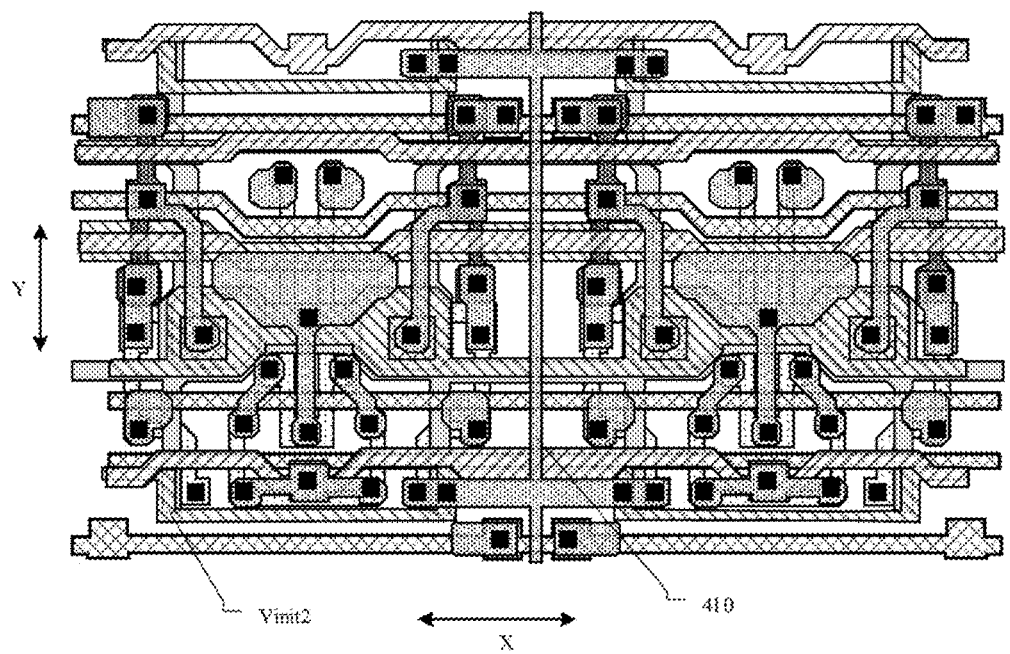
FIG. 47 is a structural layout of a light-shielding layer, a first active layer, a first conductive layer, a second conductive layer, a second active layer, a third conductive layer, and a fourth conductive layer in the display panel according to another exemplary embodiment of the present disclosure.
Figure 48:
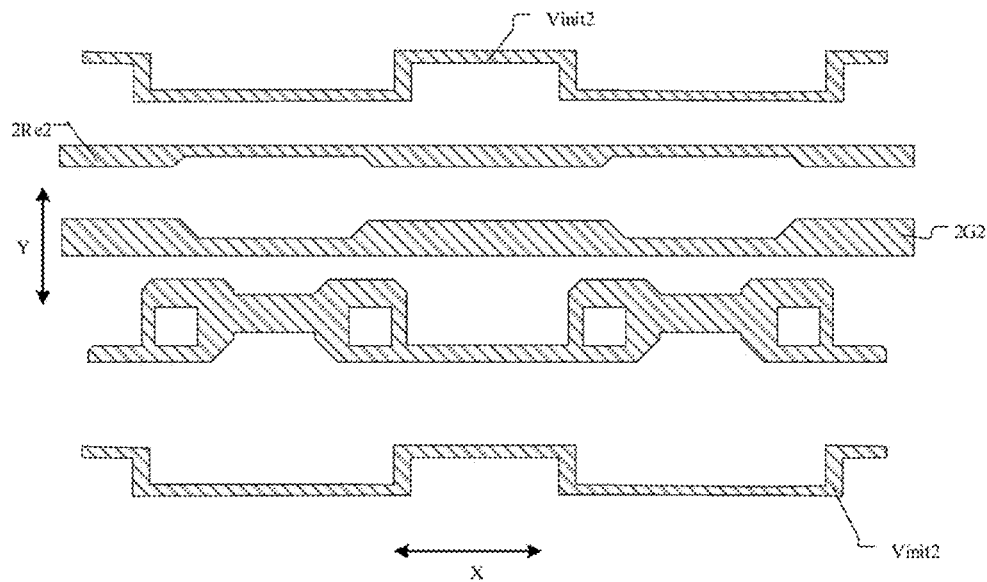
FIG. 48 is a structural layout of the second conductive layer in FIG. 47.
Figure 49:
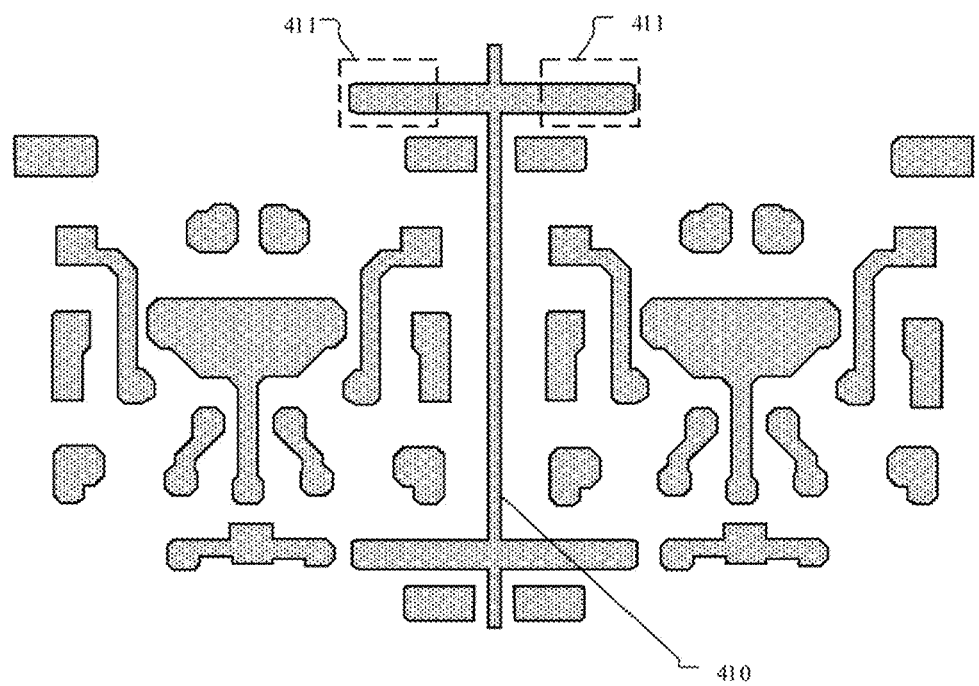
FIG. 49 is a structural layout of the fourth conductive layer in FIG. 47.

As shown in FIGS. 47, 48 and 49, FIG. 47 is a structural layout of a light-shielding layer, a first active layer, a first conductive layer, a second conductive layer, a second active layer, a third conductive layer and a fourth conductive layer of the display panel according to another exemplary embodiment of the present disclosure; FIG. 48 is the structural layout of the second conductive layer in FIG. 47; and FIG. 49 is the structural layout of the fourth conductive layer in FIG. 47. The difference between the hierarchical structures in the display panel shown in FIG. 47 and the corresponding hierarchical structures in the display panel shown in FIG. 36 is in that, the second conductive layer and the fourth conductive layer have different partial structures. As shown in FIG. 48, the second initial signal line Vinit2 may be arranged on the second conductive layer, and the distance between the second conductive layer and the first active layer is relatively close, so that yield of the via hole between the second initial signal line Vinit2 and the twelfth active portion 712 may be improved. As shown in FIG. 49, the fourth conductive layer may further include a connection line 410 and a bridge part 411. In the same pixel driving circuit, the bridge part 411 is respectively connected to the second initial signal line Vinit2 and the twelfth active portion 712 through via holes. The orthographic projection of the connection line 410 on the base substrate extends along the second direction Y. The connection line 410 is connected between two bridge parts 411 in the adjacent repeating units along the first direction X, and is further connected between two bridge parts 411 in the adjacent pixel driving circuits along the second direction Y. The connection line 410 may connect the second initial signal line Vinit2 into a grid structure, thereby reducing the voltage drop of the second initial signal line Vinit2.

In the same display panel according to other exemplary embodiments, the first initial signal line Vinit1 may be configured into grid by the structure shown in FIG. 44, and the second initial signal line Vinit2 may be configured into grid by the structure shown in FIG. 47. The connection lines 49 and 410 may be arranged between different repeating units. For example, the connection line 49 and the connection line 410 may be arranged alternately in the first direction X in sequence.

Figure 50:
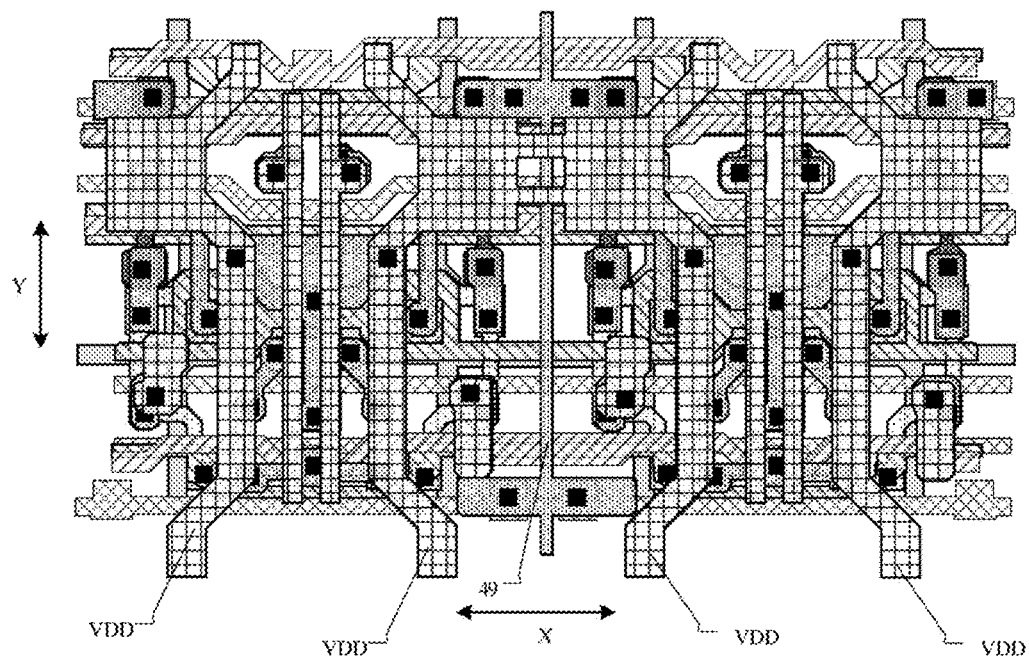
FIG. 50 is a structural layout of a display panel according to another exemplary embodiment of the present disclosure.
Figure 51:
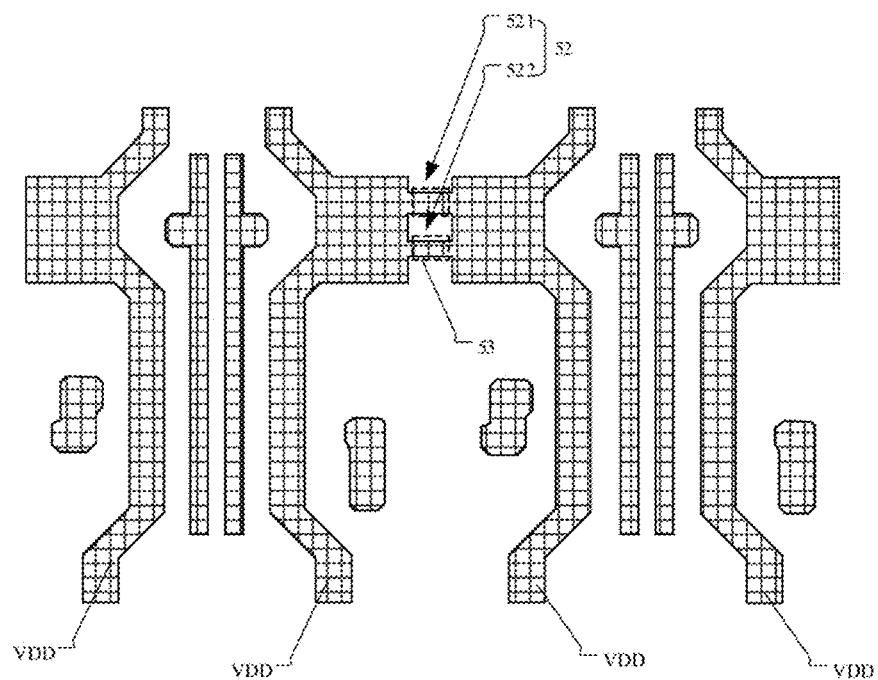
FIG. 51 is a structural layout of the fifth conductive layer in FIG. 50.

As shown in FIGS. 50 and 51, FIG. 50 is a structural layout of the display panel according to another exemplary embodiment of the present disclosure, and FIG. 51 is a structural layout of the fifth conductive layer in FIG. 50. The display panel shown in FIG. 50 includes the structure of the display panel shown in FIG. 44, and the display panel shown in FIG. 50 has a fifth conductive layer formed on a side of the fourth conductive layer away from the base substrate. The only difference between the fifth conductive layer in FIG. 51 and the fifth conductive layer in FIG. 36 is that, between adjacent repeating units, a hollow portion 52 may be provided on the connected power supply line VDD, and the hollow portion 52 may be located in the light-transmitting area of the display panel. This setting helps to increase the transmittance of the display panel. In addition, the orthographic projection of the hollow portion 52 on the base substrate may overlap with the orthographic projection of the connection line 49 on the base substrate. This helps to reduce the coupling effect between the power supply line VDD and the first initial signal line Vinit1. As shown in FIG. 51, the connected power supply lines VDD may be connected through two connection parts 53, and accordingly, the hollow portion 52 may include a closed hollow portion 522 and a non-closed hollow portion 521. In addition, the hollow portion 52 may also include only non-closed hollow portions. For example, the connected power supply line VDD may be connected through only one connection part 53.

Figure 52:
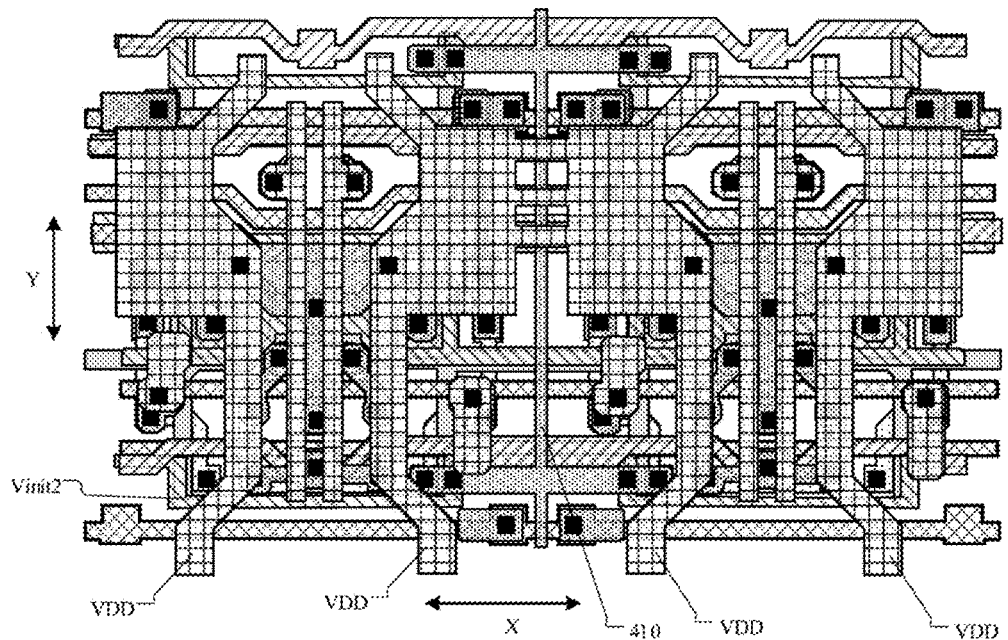
FIG. 52 is a structural layout of a display panel according to another exemplary embodiment of the present disclosure.
Figure 53:
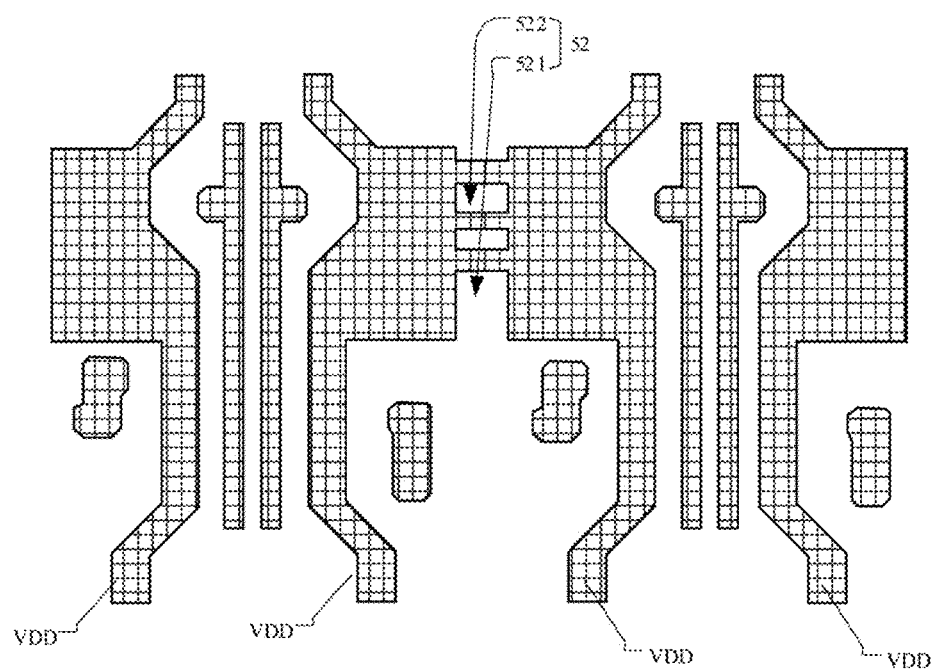
FIG. 53 is a structural layout of the fifth conductive layer in FIG. 52.

As shown in FIGS. 52 and 53, FIG. 52 is a structural layout of the display panel according to another exemplary embodiment of the present disclosure, and FIG. 53 is a structural layout of the fifth conductive layer in FIG. 52. The display panel shown in FIG. 52 includes the structure of the display panel shown in FIG. 47. The display panel shown in FIG. 52 has a fifth conductive layer formed on a side of the fourth conductive layer away from the base substrate. The only difference between the fifth conductive layer in FIG. 52 and the fifth conductive layer in FIG. 37 is that, between adjacent repeating units, a hollow portion 52 may be provided on the connected power supply line VDD, and the hollow portion 52 may be located in the light-transmitting area of the display panel. This setting helps to increase the transmittance of the display panel. In addition, the orthographic projection of the hollow portion 52 on the base substrate may overlap with the orthographic projection of the connection line 410 on the base substrate. This helps to reduce the coupling effect between the power supply line VDD and the second initial signal line Vinit2. The hollow portion 52 may include a closed hollow portion 522 and a non-closed hollow portion 521.

An exemplary embodiment of the present disclosure also provides a display device, which includes the above-mentioned display panel. The display device may be a display device such as a mobile phone, a tablet computer, and a TV.

Other embodiments of the present disclosure will readily suggest themselves to those skilled in the art upon consideration of the specification and practice of what is disclosed herein. The application is intended to cover any variations, uses, or adaptations of the present disclosure that follow the general principle of the present disclosure and include common knowledge or techniques in the technical field not disclosed by the present disclosure. The specification and examples are to be regarded as exemplary only, with the true scope and spirit of the present disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

The invention claimed is:

1. A display panel, wherein the display panel comprises a pixel driving circuit, the pixel driving circuit comprises a driving transistor and an eighth transistor, a first terminal of the eighth transistor is connected to a first terminal of the driving transistor, a second terminal of the eighth transistor is connected to a third initial signal line, and the display panel further comprises:
    a base substrate;
    a first active layer, located on a side of the base substrate, wherein the first active layer comprises an eighth active portion, a second active portion, a ninth active portion, a tenth active portion, and an eleventh active portion, the eighth active portion is connected between the ninth active portion and the tenth active portion, the eleventh active portion is connected to a side of the second active portion, the eighth active portion is used to form a channel region of the eighth transistor, the second active portion is used to form a channel region of the driving transistor, and the ninth active portion is electrically connected to the eleventh active portion;
    a first conductive layer, located on a side of the first active layer away from the base substrate, wherein the first conductive layer comprises a first reset signal line and a first conductive portion, an orthographic projection on the base substrate of the first reset signal line extends along a first direction and covers an orthographic projection on the base substrate of the eighth active portion, a partial structure of the first reset signal line is used to form a gate of the eighth transistor, an orthographic projection on the base substrate of the first conductive portion covers an orthographic projection on the base substrate of the second active portion, and the first conductive portion is used to form a gate of the driving transistor; and
    the third initial signal line, electrically connected to the tenth active portion.

2. The display panel according to claim 1, wherein the display panel further comprises:
    a third conductive layer, located on a side of the first conductive portion away from the base substrate, the third conductive layer comprising the third initial signal line.

3. The display panel according to claim 2, wherein an orthographic projection on the base substrate of the third initial signal line at least partially overlaps with an orthographic projection on the base substrate of the first reset signal line.

4. The display panel according to claim 2, wherein the display panel further comprises:
    a fourth conductive layer, located on a side of the third conductive layer away from the base substrate, the fourth conductive layer comprising a first bridge part, and the first bridge part being connected to the third initial signal line and the tenth active portion respectively through via holes.

5. The display panel according to claim 1, wherein
the pixel driving circuit further comprises a fifth transistor, a first terminal of the fifth transistor being connected to a power supply line, and a second terminal of the fifth transistor being connected to a first terminal of the driving transistor;
the first active layer further comprises: a fifth active portion, used to form a channel region of the fifth transistor, the fifth active portion being connected to a side of the eleventh active portion away from the second active portion;
the first conductive layer further comprises: an enable signal line, wherein an orthographic projection on the base substrate of the enable signal line extends along the first direction, covers an orthographic projection on the base substrate of the fifth active portion, and is located between an orthographic projection on the base substrate of the eleventh active portion and an orthographic projection on the base substrate of the ninth active portion, and a partial structure of the enable signal line is used to form a gate of the fifth transistor;
the display panel further comprises: a fourth conductive layer, located on a side of the first conductive layer away from the base substrate; and
the fourth conductive layer comprises: a second bridge part, connected to the ninth active portion and the eleventh active portion respectively through via holes.

6. The display panel according to claim 5, wherein
an orthographic projection on the base substrate of the ninth active portion is located between an orthographic projection on the base substrate of the first reset signal line and an orthographic projection on the base substrate of the enable signal line.

7. The display panel according to claim 1, wherein
the pixel driving circuit further comprises a sixth transistor and a seventh transistor, wherein a first terminal of the sixth transistor is connected to a second terminal of the driving transistor, a gate of the sixth transistor is connected to an enable signal line, a first terminal of the seventh transistor is connected to a second initial signal line, a second terminal of the seventh transistor is connected to a second terminal of the sixth transistor, and a gate of the seventh transistor is connected to the first reset signal line;
the first active layer further comprises:
a sixth active portion, connected to a side of the second active portion away from the eleventh active portion, and used to form a channel region of the sixth transistor;
a seventh active portion, connected to a side of the sixth active portion away from the second active portion, and used to form a channel region of the seventh transistor; and
a twelfth active portion, connected to a side of the seventh active portion away from the sixth active portion;
the first conductive layer further includes: an enable signal line, wherein an orthographic projection on the base substrate of the enable signal line extends along the first direction and covers an orthographic projection on the base substrate of the sixth active portion, and a partial structure of the enable signal line is used to form a gate of the sixth transistor;
an orthographic projection on the base substrate of the first reset signal line covers an orthographic projection on the base substrate of the seventh active portion, and a partial structure of the first reset signal line is used to form a gate of the seventh transistor; and
the display panel further comprises: a fourth conductive layer, located on a side of the first conductive layer away from the base substrate, wherein the fourth conductive layer comprises the second initial signal line, and the second initial signal line is connected to the twelfth active portion through a via hole.

8. The display panel according to claim 1, wherein
the pixel driving circuit further comprises a third transistor and a fourth transistor;
a first terminal of the third transistor is connected to a gate of the driving transistor, a second terminal of the third transistor is connected to a second terminal of the driving transistor, and a gate of the third transistor is connected to a second gate line;
a first terminal of the fourth transistor is connected to a first initial signal line, a second terminal of the fourth transistor is connected to a gate of the driving transistor, and a gate of the fourth transistor is connected to a second reset signal line;
the display panel further comprises:
a second active layer, located on a side of the first conductive layer away from the base substrate, wherein the second active layer comprises: a third active portion, used to form a channel region of the third transistor, and a fourth active portion, used to form a channel region of the fourth transistor; and
a third conductive layer, located on a side of the second active layer away from the base substrate,
wherein the third conductive layer comprises:
the second gate line, an orthographic projection on the base substrate of the second gate line extending along the first direction and covering an orthographic projection on the base substrate of the third active portion, and a partial structure of the second gate line being used to form a top gate of the third transistor; and
the second reset signal line, an orthographic projection on the base substrate of the second reset signal line extending along the first direction and covering an orthographic projection on the base substrate of the fourth active portion, and a partial structure of the second reset signal line being used to form a top gate of the fourth transistor.

9. The display panel according to claim 8, wherein
the display panel further comprises: a second conductive layer, located between the first conductive layer and the second active layer; and
the second conductive layer comprises:
a third gate line, wherein an orthographic projection on the base substrate of the third gate line extends along the first direction and covers an orthographic projection on the base substrate of the third active portion, and a partial structure of the third gate line is used to form a bottom gate of the third transistor; and
a third reset signal line, wherein an orthographic projection on the base substrate of the third reset signal line extends along the first direction and covers an orthographic projection on the base substrate of the fourth active portion, and a partial structure of the third reset signal line is used to form a bottom gate of the fourth transistor.

10. The display panel according to claim 8, wherein
an orthographic projection on the base substrate of the second gate line is located at a side of an orthographic projection on the base substrate of the first conductive portion away from an orthographic projection on the base substrate of the first reset signal line; and an orthographic projection on the base substrate of the second reset signal line is located at a side of an orthographic projection on the base substrate of the second gate line away from an orthographic projection on the base substrate of the first conductive portion.

11. The display panel according to claim 10, wherein the pixel driving circuit further comprises a sixth transistor and a seventh transistor, wherein a first terminal of the sixth transistor is connected to a second terminal of the driving transistor, a first terminal of the seventh transistor is connected to a second initial signal line, and a second terminal of the seventh transistor is connected to a second terminal of the sixth transistor;

the display panel further comprises: a fourth conductive layer, located on a side of the third conductive layer away from the base substrate, the fourth conductive layer comprising the second initial signal line;

the first conductive layer further comprises the first initial signal line, wherein an orthographic projection on the base substrate of the first initial signal line extends along the first direction, and is located at a side of an orthographic projection on the base substrate of the second reset signal line away from an orthographic projection on the base substrate of the second gate line;

the display panel comprises a plurality of pixel driving circuits arranged in a second direction and the first direction, the first direction being a row direction, and the second direction being a column direction; and an orthographic projection on the base substrate of the first initial signal line in the pixel driving circuit of a row at least partially overlaps with an orthographic projection on the base substrate of the second initial signal line in the pixel driving circuit of a previous row.

12. The display panel according to claim 8, wherein the pixel driving circuit further comprises a first transistor, wherein a first terminal of the first transistor is connected to a data line, a second terminal of the first transistor is connected to a first terminal of the driving transistor, and a gate of the first transistor is connected to a first gate line;

the first active layer further comprises: a first active portion, used for forming a channel region of the first transistor;

the first conductive layer further comprises: the first gate line, wherein an orthographic projection on the base substrate of the first gate line extends along the first direction and covers an orthographic projection on the base substrate of the first active portion, and a partial structure of the first gate line is used to form a gate of the first transistor; and an orthographic projection on the base substrate of the first gate line is located between an orthographic projection on the base substrate of the second gate line and an orthographic projection on the base substrate of the second reset signal line.

13. The display panel according to claim 12, wherein display panel further comprises:

a fourth conductive layer; and a fifth conductive layer, located on a side of the fourth conductive layer away from the base substrate, the fifth conductive layer comprising the data line, an orthographic projection on the base substrate of the data line extending along a second direction, and the second direction intersecting with the first direction.

14. The display panel according to claim 1, wherein the display panel comprises a plurality of pixel driving circuits, the plurality of pixel driving circuits comprising a first pixel driving circuit and a second pixel driving circuit arranged adjacently in the first direction; and the first pixel driving circuit is at least partially mirror-symmetrical with the second pixel driving circuit.

15. The display panel according to claim 14, wherein the display panel further comprises:

a fourth conductive layer, located on a side of the first conductive layer away from the base substrate, the fourth conductive layer comprising a first bridge part, and the first bridge part being connected to the third initial signal line and the tenth active portion respectively through via holes;

the first active layer further comprises: a thirteenth active portion, connected between the tenth active portion in the first pixel driving circuit and the tenth active portion in the second pixel driving circuit; and the first bridge part in the first pixel driving circuit is reused as the first bridge part in the second pixel driving circuit.

16. The display panel according to claim 15, wherein the eighth transistor in the first pixel driving circuit is reused as the eighth transistor in the second pixel driving circuit.

17. The display panel according to claim 16, wherein the fourth conductive layer further comprises: a second bridge part, connected to the ninth active portion and the eleventh active portion respectively through via holes;

the eighth active portion in the first pixel driving circuit is reused as the eighth active portion in the second pixel driving circuit;

the ninth active portion in the first pixel driving circuit is reused as the ninth active portion in the second pixel driving circuit;

the tenth active portion in the first pixel driving circuit is reused as the tenth active portion in the second pixel driving circuit;

the display panel further comprises: a ninth bridge part; and the second bridge part in the first pixel driving circuit is further connected to the ninth bridge part through a via hole, and the second bridge part in the second pixel driving circuit is connected to the ninth bridge part through a via hole, for connecting with the ninth active portion in the first pixel driving circuit.

18. The display panel according to claim 17, wherein the display panel further comprises: a second conductive layer, the second conductive layer being located on a side of the first conductive layer away from the base substrate, and the second conductive layer comprising the ninth bridge part.

19. The display panel according to claim 14, wherein the pixel driving circuit further comprises a capacitor and a fifth transistor, wherein a first terminal of the fifth transistor is connected to a power supply line, a second terminal of the fifth transistor is connected to a first terminal of the driving transistor, a first electrode of the capacitor is connected to a gate of the driving transistor, and a second electrode of the capacitor is connected to the power supply line;

the first active layer further comprises:

a fifth active portion, connected to a side of the eleventh active portion away from the second active portion, and used for forming a channel region of the fifth transistor; and a fourteenth active portion, connected between the fifth active portion in the first pixel driving circuit and the fifth active portion in the second pixel driving circuit;

the display panel further comprises:

a second conductive layer, located on a side of the first conductive layer away from the base substrate;

a fourth conductive layer, located on a side of the second conductive layer away from the base substrate; and a fifth conductive layer, located on a side of the fourth conductive layer away from the base substrate, wherein the second conductive layer comprises:

a second conductive portion, an orthographic projection on the base substrate of the second conductive portion at least partially overlapping with an orthographic projection on the base substrate of the first conductive portion, the first conductive portion being used to form a first electrode of the capacitor, and the second conductive portion being used to form a second electrode of the capacitor; and a first connection part, connected between the second conductive portion in the first pixel driving circuit and the second conductive portion in the second pixel driving circuit;

wherein the fourth conductive layer comprises:

a third bridge part, connected to the fourteenth active portion and the first connection part respectively through via holes;

wherein the fifth conductive layer comprises:

the power supply line, an orthographic projection on the base substrate of the power supply line extending along a second direction, and the second direction intersecting with the first direction; and wherein the power supply line in the first pixel driving circuit and the power supply line in the second pixel driving circuit are respectively connected to the third bridge part through via holes.

20. A display device, comprising a display panel, wherein the display panel comprises a pixel driving circuit, the pixel driving circuit comprises a driving transistor and an eighth transistor, a first terminal of the eighth transistor is connected to a first terminal of the driving transistor, a second terminal of the eighth transistor is connected to a third initial signal line, and the display panel further comprises:

a base substrate;

a first active layer, located on a side of the base substrate, wherein the first active layer comprises an eighth active portion, a second active portion, a ninth active portion, a tenth active portion, and an eleventh active portion, the eighth active portion is connected between the ninth active portion and the tenth active portion, the eleventh active portion is connected to a side of the second active portion, the eighth active portion is used to form a channel region of the eighth transistor, the second active portion is used to form a channel region of the driving transistor, and the ninth active portion is electrically connected to the eleventh active portion;

a first conductive layer, located on a side of the first active layer away from the base substrate, wherein the first conductive layer comprises a first reset signal line and a first conductive portion, an orthographic projection on the base substrate of the first reset signal line extends along a first direction and covers an orthographic projection on the base substrate of the eighth active portion, a partial structure of the first reset signal line is used to form a gate of the eighth transistor, an orthographic projection on the base substrate of the first conductive portion covers an orthographic projection on the base substrate of the second active portion, and the first conductive portion is used to form a gate of the driving transistor; and the third initial signal line, electrically connected to the tenth active portion.

* * * * *